(12) United States Patent
Feng et al.

(10) Patent No.: US 12,456,668 B2
(45) Date of Patent: Oct. 28, 2025

(54) PACKAGE STRUCTURE, ANTENNA MODULE AND PROBE CARD

(71) Applicant: Industrial Technology Research Institute, Hsinchu (TW)

(72) Inventors: Chieh-Wei Feng, Taoyuan (TW); Tai-Jui Wang, Kaohsiung (TW); Jui-Wen Yang, New Taipei (TW); Tzu-Yang Ting, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 883 days.

(21) Appl. No.: 17/707,964

(22) Filed: Mar. 30, 2022

(65) Prior Publication Data

US 2023/0071946 A1 Mar. 9, 2023

Related U.S. Application Data

(60) Provisional application No. 63/238,779, filed on Aug. 31, 2021.

(30) Foreign Application Priority Data

Feb. 22, 2022 (TW) .................. 111106297

(51) Int. Cl.
*H01L 23/498* (2006.01)
*G01R 1/073* (2006.01)
*H01L 23/66* (2006.01)

(52) U.S. Cl.
CPC .... *H01L 23/49822* (2013.01); *G01R 1/07342* (2013.01); *H01L 23/66* (2013.01);
(Continued)

(58) Field of Classification Search
CPC ............... H01L 23/49822; H01L 23/66; H01L 2223/6616; H01L 2223/6677; G01R 1/07342
See application file for complete search history.

(56) References Cited

U.S. PATENT DOCUMENTS 7,416,954 B2 8/2008 Block et al.
10,991,652 B2 4/2021 Kabir et al.
(Continued)

FOREIGN PATENT DOCUMENTS

CN 111834367 10/2020
TW 201941390 10/2019
(Continued)

OTHER PUBLICATIONS

"Office Action of Taiwan Counterpart Application", issued on Aug. 15, 2022, p. 1-p. 3.

*Primary Examiner* — Peniel M Gumedzoe
(74) *Attorney, Agent, or Firm* — JCIPRNET

(57) ABSTRACT

The present disclosure provides a package structure, an antenna module, and a probe card. The package structure includes a connection member and a first redistribution structure disposed on the connection member. The connection member includes a conductive connector and an insulation layer surrounding the conductive connector. The first redistribution structure includes a first dielectric layer, and a first wiring pattern, and a first device. The first dielectric layer is disposed on the connection member. The first wiring pattern is disposed in the first dielectric layer. The first device is disposed above the first dielectric layer and is electrically connected to the conductive connector.

19 Claims, 16 Drawing Sheets

(52) U.S. Cl.
CPC ............... *H01L 2223/6616* (2013.01); *H01L 2223/6677* (2013.01)

(56) References Cited

U.S. PATENT DOCUMENTS

| | | | | |
|---|---|---|---|---|
| 2011/0068433 | A1* | 3/2011 | Kim | H01L 23/645 257/659 |
| 2011/0147920 | A1* | 6/2011 | Choudhury | H01L 23/3677 438/122 |
| 2021/0035928 | A1 | 2/2021 | Kuo et al. | |
| 2021/0265276 | A1 | 8/2021 | Wu et al. | |

FOREIGN PATENT DOCUMENTS

| | | |
|---|---|---|
| TW | 202002105 | 1/2020 |
| TW | I693873 | 5/2020 |

\* cited by examiner

PACKAGE STRUCTURE, ANTENNA MODULE AND PROBE CARD

CROSS-REFERENCE TO RELATED APPLICATION

This application claims the priority benefit of U.S. provisional application Ser. No. 63/238,779, filed on Aug. 31, 2021 and Taiwan application Ser. No. 111106297, filed on Feb. 22, 2022. The entirety of each of the above-mentioned patent applications is hereby incorporated by reference herein and made a part of this specification.

TECHNICAL FIELD

The disclosure relates to a package structure, an antenna module and a probe card.

BACKGROUND

In recent years, electronic devices have become more and more important to human life. In order to enable electronic devices to achieve light, thin and short designs, semiconductor packaging technology has also been advancing day by day to develop products that meet the requirements of small size, light weight, high density, and high competitiveness in the market. In addition, in order to accelerate the integration of various functions, most of the industry today uses component-embedded or chip-embedded types to integrate the chip and the active and passive components on the circuit substrate (system carrier) to achieve high efficiency, low power consumption, small size and other needs.

However, with the demand for electronic products toward smaller size, higher functionality, higher speed signal transmission and higher density of circuit devices, the current electronic products cannot meet the current or future needs in terms of performance and size. For example, the communication paths between current devices (e.g., the communication paths between chips and active/passive components) are relative long and thus the signal loss are relative large, the occupied area of the active/passive devices are large and cannot be integrated more integrated circuits, or it is hard to reduce the thicknesses of the active/passive devices and thus the sizes of the electronic devices are hard to decrease.

SUMMARY

An embodiment of the present disclosure provides a package structure including a connection member and a first redistribution structure. The connection member includes a conductive connector and an insulation layer surrounding the conductive connector. The first redistribution structure is disposed on the connection member and includes a first dielectric layer, a first wiring pattern, and a first device. The first dielectric layer is disposed on the connection member. The first wiring pattern is disposed in the first dielectric layer. The first device is disposed above the first dielectric layer and is electrically connected to the conductive connector.

An embodiment of the present disclosure provides an antenna module including a connection member, a redistribution structure, and a chip. The connection member includes a conductive connector and an insulation layer surrounding the conductive connector. The redistribution structure is disposed on a first side of the connection member and includes a first wiring pattern, a first dielectric layer, and an antenna device. The first wiring pattern is disposed on the connection member and is electrically connected to the conductive connector. The first dielectric layer is disposed on the connection member and covers the first wiring pattern. The antenna device is disposed above the first dielectric layer and is configured to transmit and/or accept signals, wherein the antenna device is electrically connected to the first wiring pattern. The chip is disposed above a second side of the connection member that is opposite to the first side, wherein the chip is electrically connected to the antenna device.

An embodiment of the present disclosure provides a probe card including a connection member, a first redistribution structure, a conductive probe, and a substrate. The connection member includes a conductive connector and an insulation layer surrounding the conductive connector. The first redistribution structure is disposed on a first side of the connection member and includes a first dielectric layer, a first wiring pattern, and a first device. The first dielectric layer is disposed on the connection member. The first wiring pattern is disposed in the first dielectric layer. The first device is disposed above the first dielectric layer and is electrically connected to conductive connector. The conductive probe is disposed above the first redistribution structure and is electrically connected to the first device. The substrate is disposed on a second side of the connection member that is opposite to the first side, and a wiring pattern in the substrate is electrically connected to the first device of the first redistribution structure through the connection member.

Based on the above, in the package structure, the antenna module, and the probe card of the foregoing embodiments, the first device (e.g., an active device or a passive device) is designed to integrate into the first redistribution structure to reduce the communication paths between devices as well as the occupied area of the active/passive device, thereby improving the device performance and reducing the device size.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
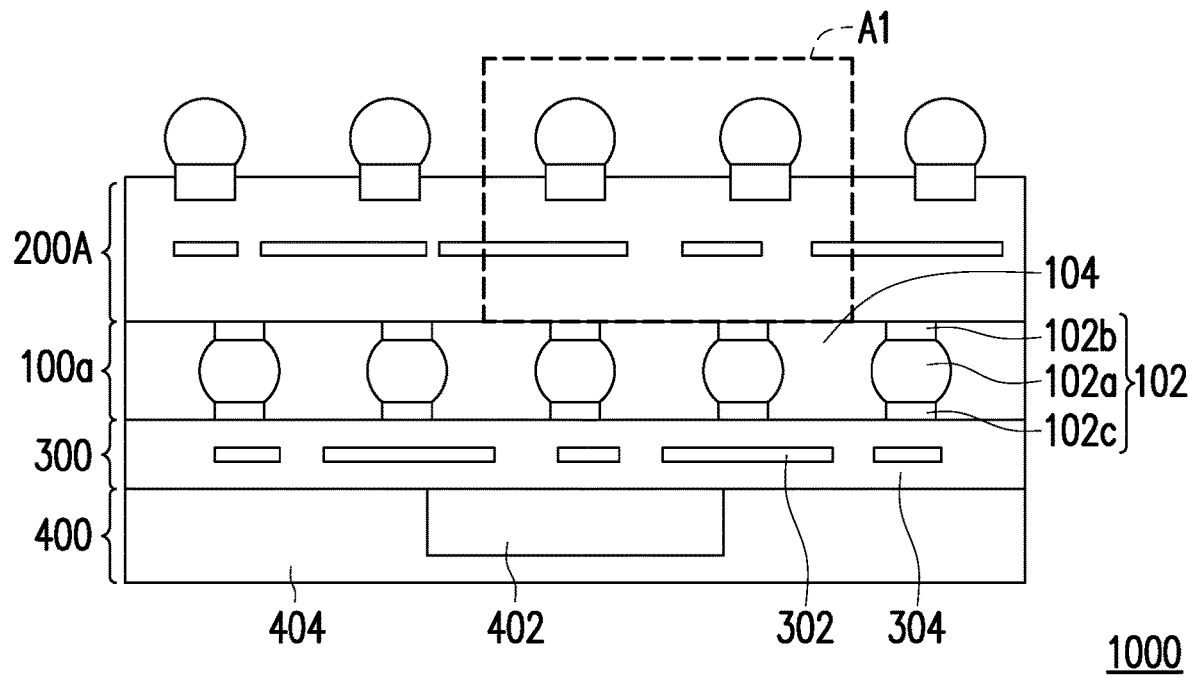
FIG. 1(a) is a schematic cross-section view illustrating a package structure of the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are omitted in order to simplify the drawing.

The disclosure will be described more comprehensively below with reference to the drawings for the embodiments. However, the disclosure may also be implemented in different forms rather than being limited by the embodiments described in the disclosure. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to physical and/or electrical connections, and "electrical connection" or "coupling" may refer to the presence of other elements between two elements.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 1B:
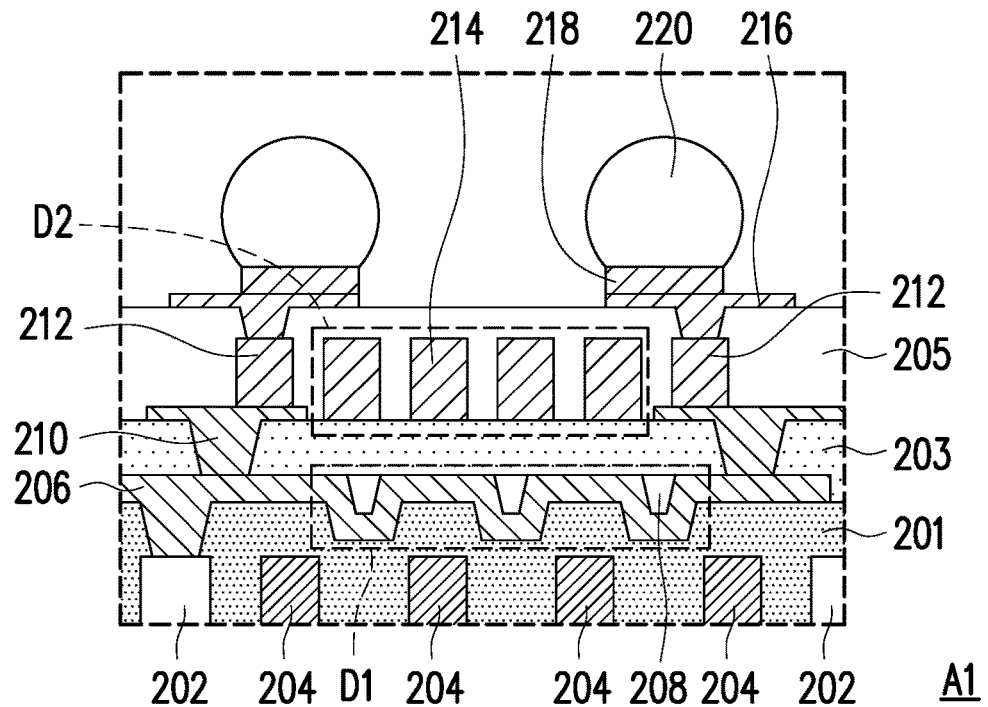
FIG. 1(b) is an enlarged schematic view of the region A1 in FIG. 1(a).
Figure 1C:
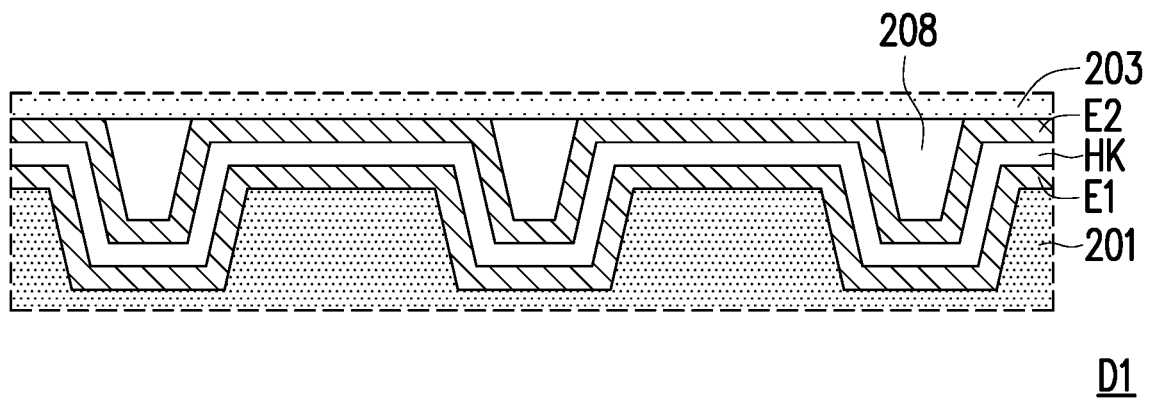
FIG. 1(c) is a schematic cross-section view illustrating the first device D1 in FIG. 1(b).
Figure 1D:
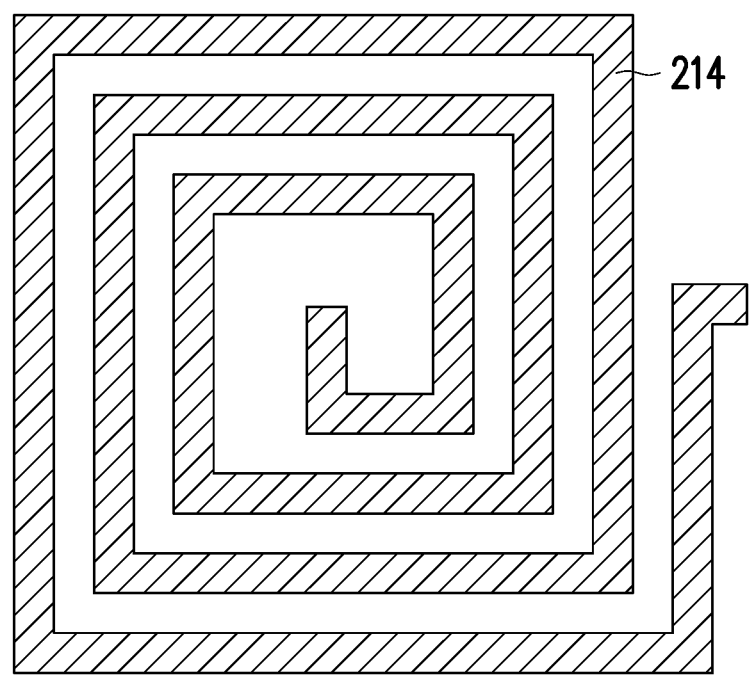
FIG. 1(d) is a schematic top view illustrating the second device D2 in FIG. 1(b).

FIG. 1(a) is a schematic cross-section view illustrating a package structure of the first embodiment of the present disclosure. FIG. 1(b) is an enlarged schematic view of the region A1 in FIG. 1(a). FIG. 1(c) is a schematic cross-section view illustrating the first device D1 in FIG. 1(b). FIG. 1(d) is a schematic top view illustrating the second device D2 in FIG. 1(b).

Referring to FIG. 1(a), a package structure 1000 may include a connection member 100a, a redistribution structure 200A, a redistribution structure 300, and an integrated circuit structure 400.

The connection member 100a includes conductive connectors 102 and an insulation layer 104 surrounding the conductive connectors 102. In some embodiments, the conductive connectors 102 may include electrical connection structures 102a, pads 102b, and pads 102c. The pads 102b connect ones ends of the electrical connection structures 102a to the redistribution structure 200A. The pads 102c connect other ends of the electrical connection structures 102a to the redistribution structure 300.

In some embodiments, the electrical connection structures 102a may include solders such as tin, tin-lead, gold, silver, tin-silver, tin-bismuth, copper, copper-tin, copper-tin-silver, copper-nickel-tin-silver, palladium, indium, nickel, nickel-palladium-gold, nickel-gold, similar materials, or combinations thereof. In some embodiments, pads 102b and 102c may include conductive materials such as metals. For example, the pads 102b and 102c may include metals such as copper, nickel, titanium, tungsten, aluminum, or the like. In some embodiments, the pads 102b may, for example, be formed on a surface of the redistribution structure 200A adjacent to the connection member 100a, and the pads 102c may, for example, be formed on a surface of the redistribution structure 300 adjacent to the connection member 100a. In this embodiment, the electrical connection structures 102a may be formed by following steps. Firstly, solder layers are formed on ones of the pads 102b and the pads 102c by using a process such as evaporation, electroplating, printing, solder transfer, balling, or the like. Next, a reflow process is performed to shape the materials into the desired solder bumps. After that, other ones of the pads 102b and pads 102c contact the above solder bumps and then the reflow process is performed in subsequence to form electrical connection structures 102a. That is, the electrical connection structures 102a may be solder joints between the pads 102b and the pads 102c to connect the redistribution structure 200A to the redistribution structure 300. The insulation layer 104 may reduce the stress and protect the electrical connection structures 102a. In some embodiments, the insulation layer 104 may be an underfill.

In some other embodiments, the connection member 100a may be a build-up wiring structure. For example, the conductive connectors 102 may be conductive vias penetrating the insulation layer 104. In the case where the connection member 100a is the build-up wiring structure, the conductive connectors 102 may, for example, be formed by following steps. Firstly, through holes (not shown) are formed in the insulation layer 104 by using a laser drilling, for example. Then, conductive vias are formed in the through holes by using an electroplating, for example.

The redistribution structure 300 may include a redistribution layer 302 and an insulation layer 304, wherein the redistribution layer 302 may be formed in the insulation layer 304. In some embodiments, the redistribution layer 302 may include vias and/or wiring layers. The vias may extend through the insulation layer 304, and the wiring layers may extend along the insulation layer 304. The vias and/or the wiring layers may include conductive materials. The conductive materials may include metals or metal alloys. For example, the conductive materials may include metals such as copper, titanium, tungsten, aluminum, or the like, or combinations thereof. In some embodiments, the insulation layer 304 may be formed of polymers. The polymers may be, for example, photosensitive materials such as PBO, polyimide, BCB-based polymers, or the like that may be patterned by using a lithographic mask. In some other embodiments, the insulation layer 304 may be formed by following materials: nitrides such silicon nitride; oxides such as silicon oxide, PSG, BSG, or BPSG; or the likes. In this embodiment, the insulation layer 304 may be formed by a process such as spin coating, lamination, CVD, or the like, or combinations thereof.

The integrated circuit structure 400 may include an integrated circuit 402 and an insulation layer 404 surrounding the integrated circuit 402. The integrated circuit 402 may include a RF chip. The insulation layer 404 may be, for example, an epoxy molding compound (EMC). The redistribution structure 300 may be electrically connected to the integrated circuit structure 400.

Referring to FIG. 1(a) and FIG. 1(b), the redistribution structure 200A is disposed on the connection member 100a. In some embodiments, the redistribution structure 200A may include a first redistribution structure. The first redistribution structure may include a first dielectric layer 201, a first wiring pattern 202, and a first device D1. The first dielectric layer 201 may be disposed on the connection member 100a. The first wiring pattern 202 may be disposed in the first dielectric layer 201. The first device D1 may be disposed above the first dielectric layer 201 and may be electrically connected to the conductive connector 102 of the connection member 100a. The first device D1 may be electrically connected to the integrated circuit 402 through the first wiring pattern 202, the connection member 100a, and the redistribution structure 300. That is, the first device D1 may be integrated in the first redistribution structure of the redistribution structure 200A to reduce the lengths of the communication paths between the devices as well as the occupied area of the first device D1, such that the performance of the package structure 1000 can be increased, and the size of the package structure 1000 can be reduced. The first device D1 may include an active device, a passive device, or a combination thereof. For example, the first device D1 may include a capacitor, a resistor, an inductor, a filter, an antenna, or a combination thereof.

In some embodiments, the first redistribution structure of the redistribution structure 200A may include dummy patterns 204 disposed in the first dielectric layer 201. In some embodiments, the dummy patterns 204 may be electrically isolated from the conductive connectors 102 of the connection member 100a. The dummy patterns 204 may adjust the degree of planarization of a surface of the first dielectric layer 201 that is away from the dummy patterns 204. For example, referring to FIG. 1(b) and FIG. 1(c), in the case where the first device D1 includes a capacitor structure, the dummy patterns 204 may be configured to adjust the degree of planarization of the first dielectric layer 201 ranging from about 40% to about 60%, such that the first dielectric layer 201 is formed to include convex portions located on the dummy patterns 204 and concave portions located between two neighboring dummy patterns 204. In other words, the first dielectric layer 201 may have a trench structure without performing a process of forming a trench, so the trench structure may be also referred to as self-formed trench structure. As such, the capacitor (i.e., first device D1) formed on the convex portions and the concave portions of the first dielectric layer 201 may have an improved effective capacitance area and thus the occupied area of the first device D1 in the package structure 1000 can be decreased. In some embodiments, the occupied area of the first device D1 in the package structure 1000 can be decreased about 10% to about 30% by the forgoing designs.

In some embodiments, the degree of planarization of the first dielectric layer 201 may be calculated through the following Formula 1a:

$$\text{Degree of Planarization(DOP1)} = [1-(h1/T1)] \times 100\% \quad \text{[Formula 1a]}$$

In Formula 1a, DOP1 refers to the degree of planarization of the first dielectric layer 201; h1 refers to the difference between the highest height and the lowest height of the top surface of the first dielectric layer 201; and T1 refers to the thickness of the pattern covered by the first dielectric layer 201 (e.g., the thicknesses of the dummy patterns 204 or the thickness of the first wiring pattern 202).

In some embodiments, the ratio T1/h1 of the thickness T1 of the pattern that is covered by the first dielectric layer 201 to the thickness h1 of the first dielectric layer 201 ranges from 1/1.1 to 1/1.6. In some embodiments, in order to control the degree of planarization of the first dielectric layer 201 at about 40%, the following Table 1 shows the width of the pattern and the ratio relationship between the width of the pattern and the spacing of the patterns corresponding to the pattern with different thicknesses covered by the first dielectric layer 201. In Table 1, the width of the pattern covered by the first dielectric layer 201 refers to L1, and the spacing of the patterns covered by the first dielectric layer 201 refers to S1.

TABLE 1

| Thickness of the pattern (T1) | Width of the Pattern (L1) | Ratio of the width of the pattern to the spacing of the patterns (L1/S1) |
|---|---|---|
| >8 μm | ≤10 μm | about 1/6 |
|  | 10 μm-20 μm | about 1/5 |
|  | 20 μm-100 μm | about 1/3 |
|  | >100 μm | about 1/2 |
| 4 μm-8 μm | ≤10 μm | about 1/5 |
|  | 10 μm-20 μm | about 1/4 |
|  | 20 μm-100 μm | about 2/3 |
|  | >100 μm | about 1/1 |
| 1 μm-4 μm | ≤10 μm | about 1/3 |
|  | 10 μm-20 μm | about 1/2 |
|  | 20 μm-100 μm | about 1/1 |
|  | >100 μm | about 2/1 |

The capacitor structure may include a first electrode E1, a dielectric HK, and a second electrode E2. The first electrode E1 may be disposed on surfaces of the concave portions and the convex portions of the first dielectric layer 201. The dielectric HK may be disposed on the first electrode E1. The second electrode E2 may be disposed on the dielectric HK. The first electrode E1 and/or the second electrode E2 may include conductive materials. In some embodiments, the first electrode E1 and/or the second electrode E2 may include conductive materials (e.g., metal materials such as Ti and Cu) that form wirings of the redistribution structure. That is, the process of forming the first electrode E1 and/or the second electrode E2 may be integrated in the process of forming the wiring layer of the redistribution structure. The dielectric HK may include dielectrics with high dielectric constant. For example, the material of the dielectric HK may be a high dielectric constant material with a dielectric constant greater than 4, greater than 7, or even greater than 10, or a combination thereof. The high dielectric constant material may be, for example, a metal oxide. For example, the metal oxide may be a rare earth metal oxide such as a hafnium oxide ($HfO_2$), a hafnium silicate oxide (HfSiO), a hafnium silicon oxynitride (HfSiON), an aluminum oxide ($Al_2O_3$), a yttrium oxide ($Y_2O_3$), a lanthanum oxide ($La_2O_3$), a lanthanum aluminum oxide (LaAlO), a tantalum oxide ($Ta_2O_5$), a zirconium oxide ($ZrO_2$), a zirconium silicon oxide ($ZrSiO_4$), a hafnium zirconium oxide (HfZrO), a strontium bismuth tantalate ($SrBi_2Ta_2O_9$, SBT), or a combination thereof.

In some embodiments, the first redistribution structure may include a wiring layer 206 disposed on the first dielectric layer 201 and electrically connected to the first wiring pattern 202. In some embodiments, the wiring layer 206 may be electrically connected to the capacitor structure. In some embodiments, the process of forming the capacitor structure may be integrated in the process of forming the wiring layer 206. For example, the process of forming the first electrode E1 and/or the second electrode E2 may be integrated in the process of forming the wiring layer 206.

In some embodiments, the capacitor structure may include compensation structures 208 disposed on the second electrode E2 and being filled in the concave portions of the first dielectric layer 201 to adjust the degree of planarization of the layer (e.g., the second dielectric layer 203) formed thereon. In some embodiments, the compensation structures 208 may include conductive materials such as metals.

In some embodiments, the redistribution structure 200A may further include a second redistribution structure disposed on the first redistribution structure. The second redistribution structure may include a second dielectric layer 203, second wiring patterns 210, and a second device D2. The second dielectric layer 203 may be disposed on the first dielectric layer 201 and may cover the wiring layer 206 and the first device D1. The second wiring patterns 210 may include vias disposed in the second dielectric layer 203 and wiring layers disposed on the second dielectric layer 203. The second device D2 may be disposed on a portion of the second dielectric layer 203 where the compensation structures 208 disposed thereunder and may be electrically connected to the first device D1. The second device D2 may include a capacitor, a resistor, an inductor, a filter, an antenna, or a combination thereof.

In some embodiments, referring to FIG. 1(b) and FIG. 1(d), in the case where the second device D2 include an inductor structure, the compensation structures 208 make the degree of planarization of the second dielectric layer 203 located on the compensation structures 208 greater than about 95%. As such, the inductor structure disposed on the portion of the second dielectric layer 203 where the compensation structures 208 disposed thereunder would be able to avoid the problem of electrical abnormality caused by an uneven wiring pattern. In some embodiments, the process of forming the inductor structure may be integrated in the process of forming the wiring layer of the second redistribution structure. For example, the second redistribution structure may include a wiring layer 212 and a wiring layer 214 that form on the second wiring patterns 210, wherein the wiring layer 212 is disposed around the wiring layer 214 and includes a portion electrically connected to the second wiring patterns 210, and the wiring layer 214 may be formed in a pattern as shown in FIG. 1(d) as the inductor structure. In some embodiments, the wiring layer 212 may include a portion electrically connected to the capacitor structure (i.e., first device D1) and a portion electrically connected to the inductor structure (i.e., second device D2). In some embodiments, the portion of the wiring layer 212 that are electrically connected to the capacitor structure is spaced apart from the inductor structure (i.e., second device D2) by at least 10 μm to reduce the electrical loss of the inductor. For example, in the case where the first device D1 is a capacitor structure and where the second device D2 is an inductor structure, the portion of the wiring layer 212 electrically connected to the first device D1 (e.g., the portion of the wiring layer 212 being configured at the right side of the second device D2 in FIG. 1(b)) is spaced apart laterally from the inductor structure (i.e., second device D2) at least 10 μm when viewing from top, for example.

In some embodiments, the degree of planarization of the second dielectric layer 203 may be calculated through following Formula 1b:

Degree of Planarization(DOP2)=[1−(h2/T2)]×100%   [Formula 1b]

In Formula 1b, DOP2 refers to the degree of planarization of the second dielectric layer 203; h2 refers to the difference between the highest height and the lowest height of the top surface of the second dielectric layer 203; and T2 refers to the thickness of the pattern covered by the second dielectric layer 203 (e.g., the thicknesses of the wiring layer 206).

In some embodiments, the ratio T2/h2 of the thickness T2 of the pattern that is covered by the second dielectric layer 203 to the thickness h2 of the second dielectric layer 201 ranges from 1/1.1 to 1/1.6. In some embodiments, in order to control the degree of planarization of the second dielectric layer 203 greater than about 95%, the following Table 2 shows the width of the pattern and the ratio relationship between the width of the pattern and the spacing of the patterns corresponding to the pattern with different thicknesses covered by the second dielectric layer 203. In Table 2, the width of the pattern covered by the second dielectric layer 203 refers to L2, and the spacing of the patterns covered by the second dielectric layer 203 refers to S2.

TABLE 2

| Thickness of the pattern (T2) | Width of (the Pattern L2) | Ratio of the width of the pattern to the spacing of the patterns (L2/S2) |
|---|---|---|
| >8 µm | ≤10 µm | >1/1 |
|  | 10 µm-20 µm | >3/1 |
|  | 20 µm-100 µm | >8/1 |
|  | >100 µm | >12/1 |
| 4 µm-8 µm | ≤10 µm | >3/2 |
|  | 10 µm-20 µm | >2/1 |
|  | 20 µm-100 µm | >5/1 |
|  | >100 µm | >10/1 |
| 1 µm-4 µm | ≤10 µm | >1/2 |
|  | 10 µm-20 µm | >1/1 |
|  | 20 µm-100 µm | >4/1 |
|  | >100 µm | >8/1 |

In some embodiments, the second redistribution structure of the redistribution structure 200A may include a third dielectric layer 205, a third wiring pattern 216, pads 218, and solder balls 200. The third dielectric layer 205 may cover the second device D2 and the second wiring patterns 210. The third wiring pattern 216 may include vias formed in the third dielectric layer 205 and wiring layers formed on the third dielectric layer 205. In some embodiments, the third wiring pattern 216 may be electrically connected to the second wiring patterns 210 through the wiring layer 212. The pads 218 may be formed on the third wiring pattern 216 and may be electrically connected to the third wiring pattern 216. The solder balls 200 may be formed on the pads 218 and may be electrically connected to the pads 218.

Figure 2A:
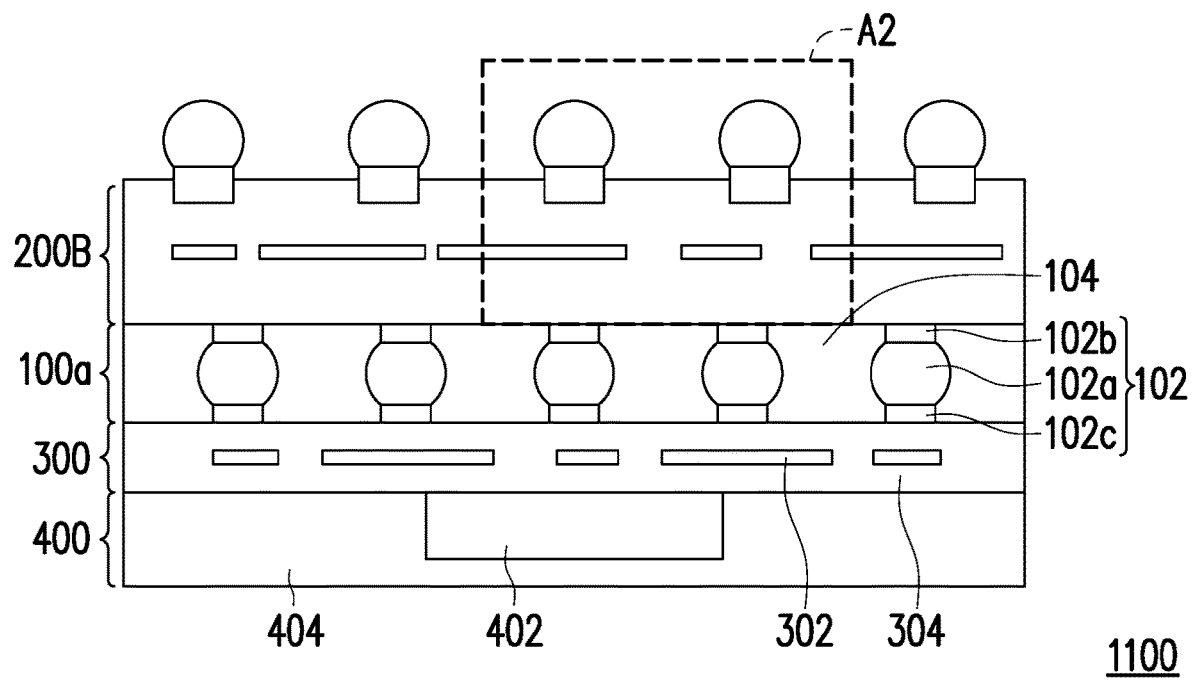
FIG. 2(a) is a schematic cross-section view illustrating a package structure of the second embodiment of the present disclosure.
Figure 2B:
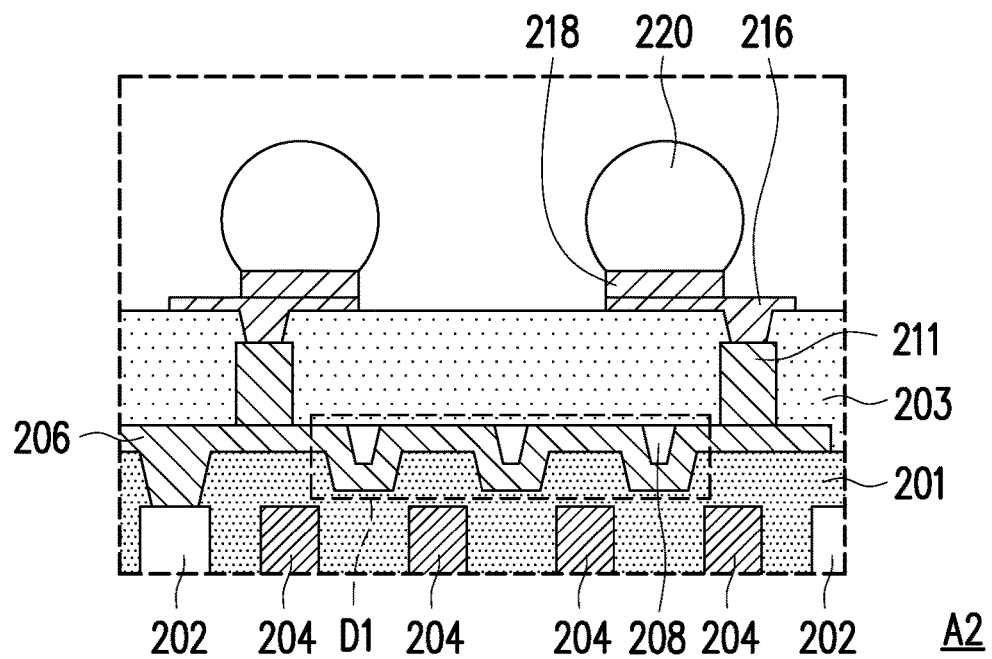
FIG. 2(b) is an enlarged schematic view of the region A2 in FIG. 2(a).

FIG. 2(a) is a schematic cross-section view illustrating a package structure of the second embodiment of the present disclosure. FIG. 2(b) is an enlarged schematic view of the region A2 in FIG. 2(a). A package structure 1100 shown in FIG. 2(a) is similar to the package structure 1000 shown in FIG. 1(a). The main difference therebetween is that the redistribution structure 200B of the package structure 1100 does not include the second device D2 shown in FIG. 1(a). Other identical or similar components/layers/patterns are denoted by the same or similar reference numerals, which are not repeated herein.

Referring to FIG. 2(a) and FIG. 2(b), the redistribution structure 200B of the package structure 1100 is disposed on the connection member 100a and may include a first redistribution structure. The first redistribution structure may include the first dielectric layer 201, the first wiring pattern 202, the first device D1, the dummy patterns 204, and the wiring layer 206 that are mentioned in the foregoing descriptions. Those components have been described in detail above, which are not be repeated herein.

In some embodiments, the redistribution structure 200B may further include a second redistribution structure disposed on the first redistribution structure. The second redistribution structure may include a second dielectric layer 203, second wiring patterns 211, a third wiring pattern 216, pads 218, and solder balls 200. The second dielectric layer 203 may be disposed on the first dielectric layer 201 and may cover the wiring layer 206. The second wiring patterns 211 may be disposed in the second dielectric layer 203 and may be electrically connected to the wiring layer 206. The third wiring pattern 216 may be electrically connected to the second wiring patterns 211 and may include vias disposed in the second dielectric layer 203 and wiring layers disposed on the second dielectric layer 203.

Figure 3A:
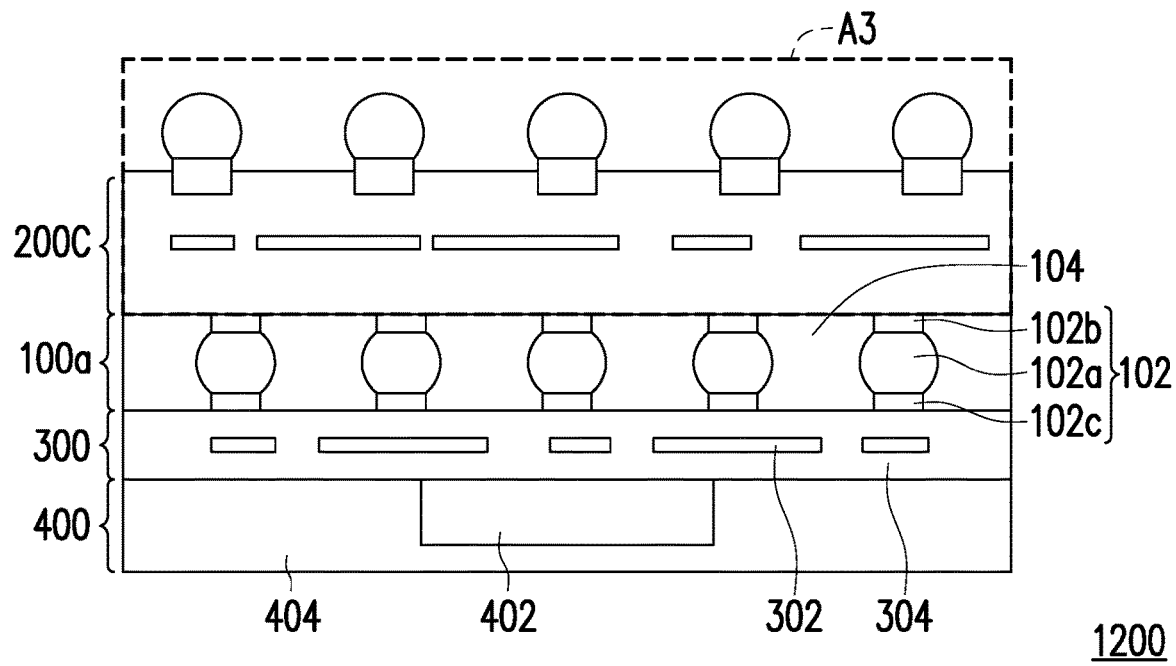
FIG. 3(a) is a schematic cross-section view illustrating a package structure of the third embodiment of the present disclosure.
Figure 3B:
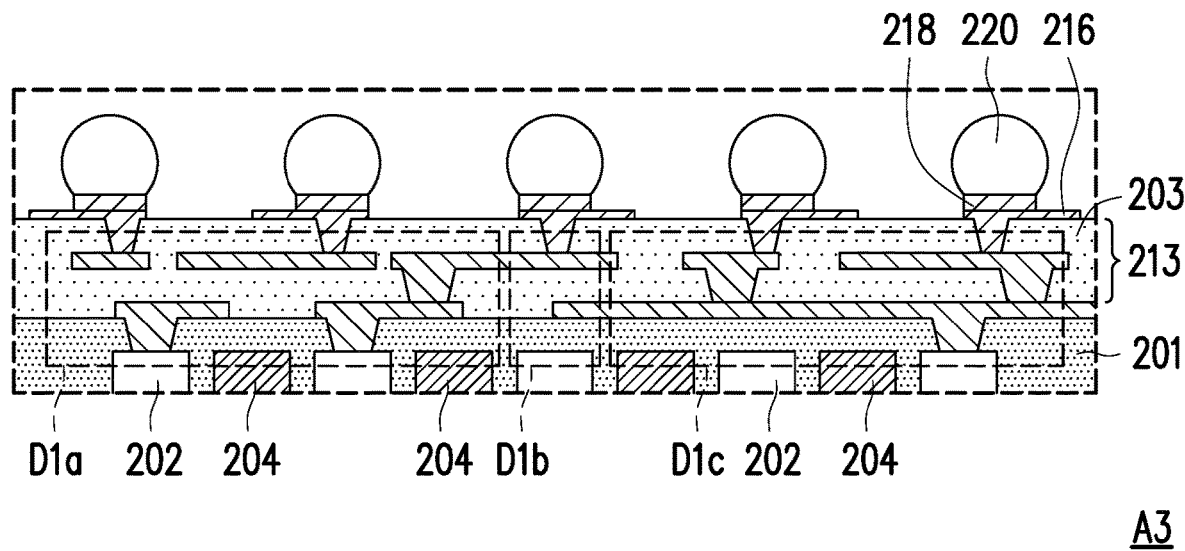
FIG. 3(b) is an enlarged schematic view of the region A3 in FIG. 3(a).

FIG. 3(a) is a schematic cross-section view illustrating a package structure of the third embodiment of the present disclosure. FIG. 3(b) is an enlarged schematic view of the region A3 in FIG. 3(a). A package structure 1200 shown in FIG. 3(a) is similar to the package structure 1000 shown in FIG. 1(a). The main difference therebetween is that the redistribution structure 200C of the package structure 1200 includes first devices D1a, D1b, and D1c that apply in different circuit regions. Other identical or similar components/layers/patterns are denoted by the same or similar reference numerals, which are not repeated herein.

Referring to FIG. 3(a) and FIG. 3(b), the redistribution structure 200C of the package structure 1200 may be disposed on the connection member 100a and may include first devices D1a, D1b, and D1c that are apply in different circuit regions and second wiring patterns 213 and the first dielectric layer 201, the first wiring pattern 202, the second dielectric layer 203, the dummy patterns 204, the third wiring pattern 216, the pads 218, and the solder balls 200 that are mentioned in the foregoing descriptions. Those components that are mentioned in the foregoing descriptions have been described in detail above, which are not be repeated herein.

The first devices D1a, D1b, and D1c may be disposed above the first dielectric layer 201. The second wiring patterns 213 may include vias disposed in the first dielectric layer 201 and wiring layers disposed on the first dielectric layer 201 and vias and wiring layers that are disposed in the second dielectric layer 203. In some embodiments, the process of forming the first devices D1a, D1b, and D1c may be integrated in the process of forming the second wiring patterns 213. For example, the first device D1a, D1b, or D1c may be, for example, a high-frequency device composed of wirings in the second wiring patterns 213. In some embodiments, the first devices D1a, D1b, and D1c may be configured in different circuit regions of the redistribution structure 200C. For example, the first device D1a may be configured in a fan-out circuit region; the first device D1b may be configured in a matching circuit region; and the first device D1c may be configured in a mm-Wave circuit region.

In some embodiments, the dummy patterns 204 are disposed in the first dielectric layer 201 and may be configured to make the degree of planarization of the first dielectric layer 201 greater than about 95%. As such, the first devices D1a, D1b, and D1c disposed on the portion of the first dielectric layer 201 where the dummy patterns 204 are disposed thereunder would be able to avoid the problem of electrical abnormality caused by an uneven wiring pattern.

Figure 4A:
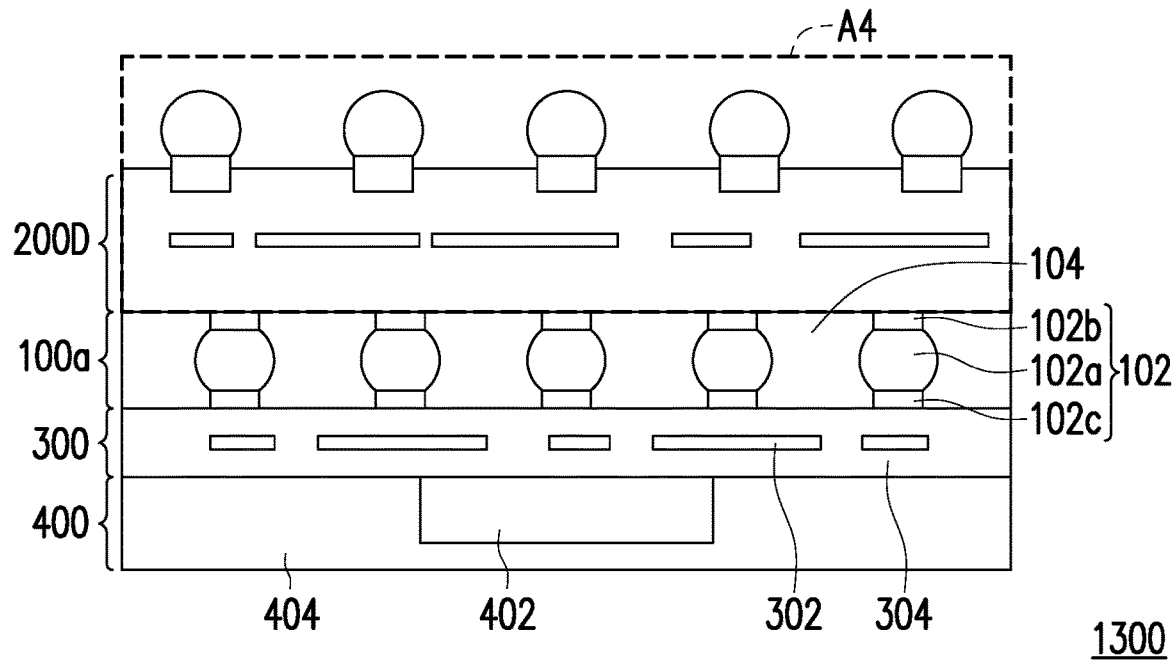
FIG. 4(a) is a schematic cross-section view illustrating a package structure of the fourth embodiment of the present disclosure.
Figure 4B:
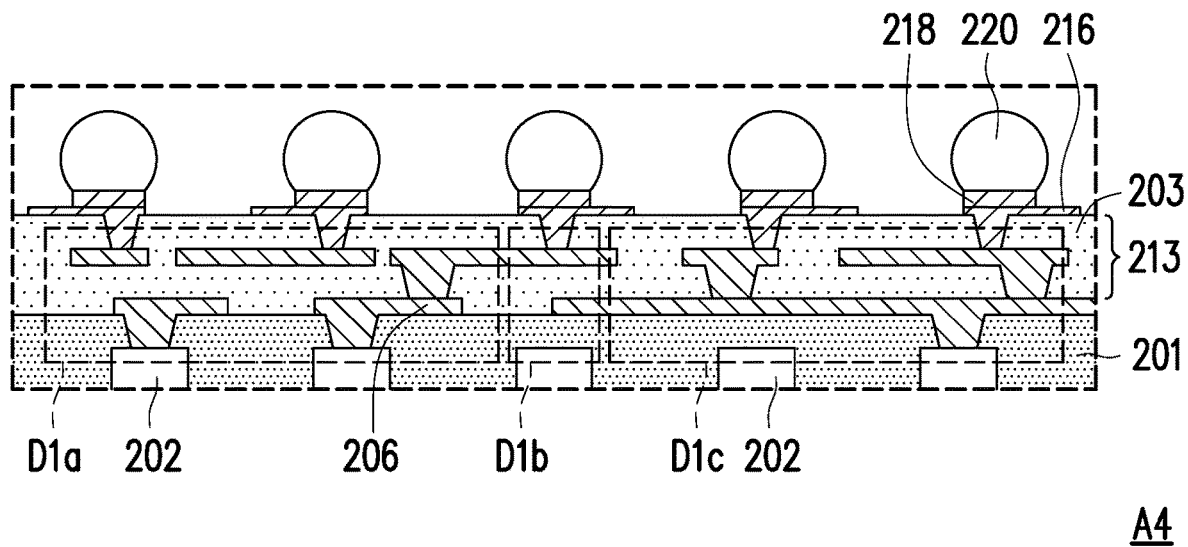
FIG. 4(b) is an enlarged schematic view of the region A4 in FIG. 4(a).

FIG. 4(a) is a schematic cross-section view illustrating a package structure of the fourth embodiment of the present disclosure. FIG. 4(b) is an enlarged schematic view of the region A4 in FIG. 4(a). A package structure 1300 shown in FIG. 4(a) is similar to the package structure 1200 shown in FIG. 3(a). The main difference therebetween is that the first dielectric layer 201 in the redistribution structure 200D of the package structure 1300 is a planarization layer (hereinafter a planarization layer 201), so that the dummy patterns 204 formed therein may be omitted. Other identical or similar components/layers/patterns are denoted by the same or similar reference numerals, which are not repeated herein.

Referring to FIG. 4(a) and FIG. 4(b), the first devices D1a, D1b, and D1c may be disposed on the planarization layer 201. The second wiring patterns 213 may include vias disposed in the planarization layer 201 and wiring layers disposed on the planarization layer 201 and vias and wiring layers disposed in the second dielectric layer 203. In this embodiment, the material of the planarization layer 201 may be different from the material of the second dielectric layer 203. In some embodiments, the process of forming the first devices D1a, D1b, and D1c may be integrated in the process of forming the second wiring patterns 213. For example, the first device D1a, D1b, or D1c may be, for example, a high-frequency device composed of wirings in the second wiring patterns 213. In some embodiments, the first devices D1a, D1b, and D1c may be configured in different circuit regions of the redistribution structure 200D. For example, the first device D1a may be configured in a fan-out circuit region; the first device D1b may be configured in a matching circuit region; and the first device D1c may be configured in a mm-Wave circuit region.

In some embodiments, the degree of planarization of the planarization layer 201 is greater than about 95%, such that the first devices D1a, D1b, and D1c disposed on the planarization layer 201 would be able to avoid the problem of electrical abnormality caused by an uneven wiring pattern.

Figure 5A:
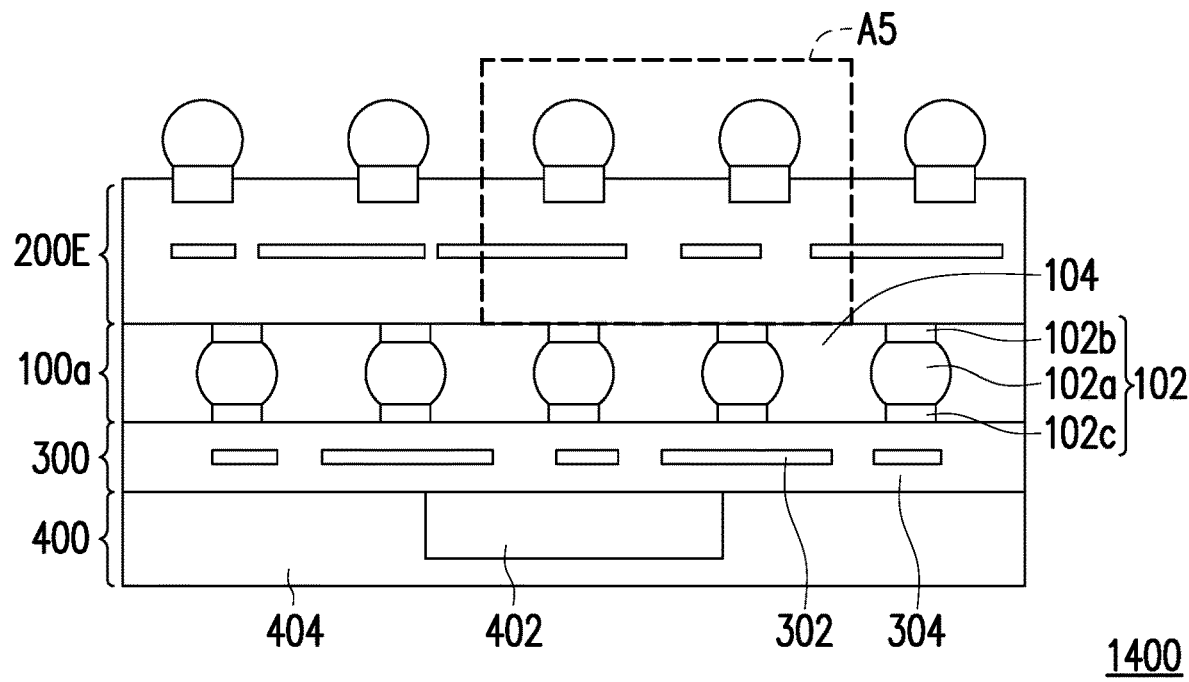
FIG. 5(a) is a schematic cross-section view illustrating a package structure of the fifth embodiment of the present disclosure.
Figure 5B:
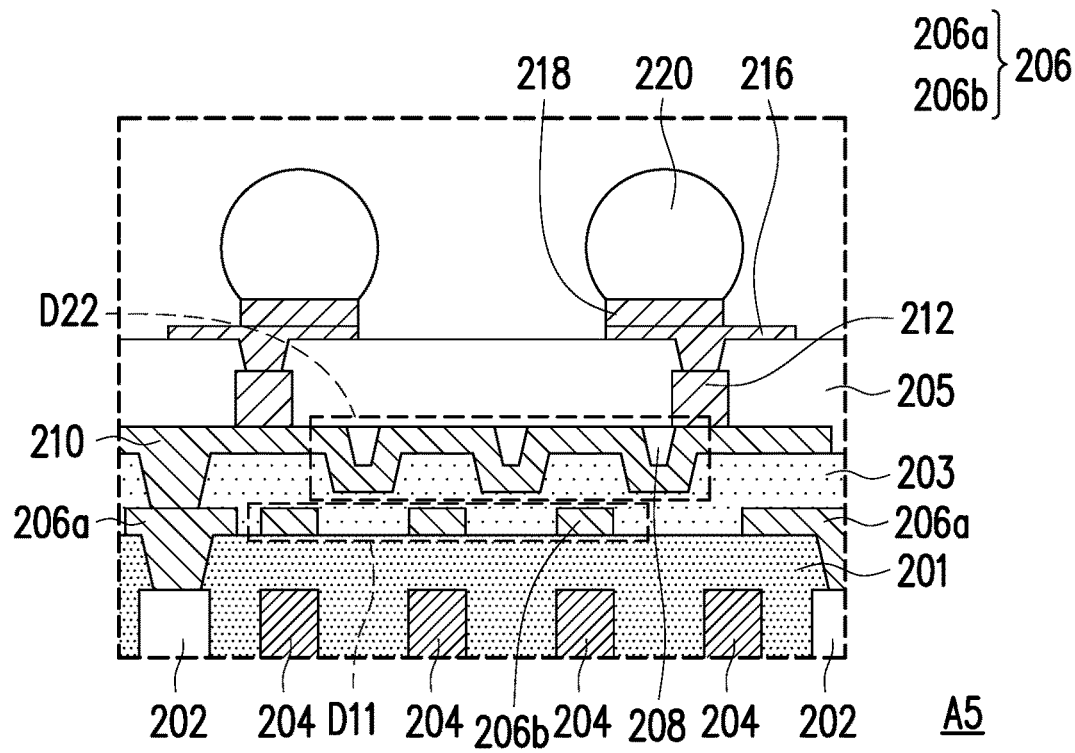
FIG. 5(b) is an enlarged schematic view of the region A5 in FIG. 5(a).

FIG. 5(a) is a schematic cross-section view illustrating a package structure of the fifth embodiment of the present disclosure. FIG. 5(b) is an enlarged schematic view of the region A5 in FIG. 5(a). A package structure 1400 shown in FIG. 5(a) is similar to the package structure 1000 shown in FIG. 1(a). The main difference therebetween is that the first device D11 and the second device D22 in the redistribution structure 200E of the package structure 1400 are different from the first device D1 and the second device D2 in the redistribution structure 200A of the package structure 1000. Other identical or similar components/layers/patterns are denoted by the same or similar reference numerals, which are not repeated herein.

Referring to FIG. 5(a) and FIG. 5(b), the redistribution structure 200E is disposed on the connection member 100a. In some embodiments, the redistribution structure 200E may include a first redistribution structure. The first redistribution structure may include a first dielectric layer 201, a first wiring pattern 202, and a first device D11. The first dielectric layer 201 may be disposed on the connection member 100a. The first wiring pattern 202 may be disposed in the first dielectric layer 201. The first device D11 may be disposed above the first dielectric layer 201 and may be electrically connected to the conductive connector 102 of the connection member 100a. The first device D11 may be electrically connected to the integrated circuit 402 through the first wiring pattern 202, the connection member 100a, the redistribution structure 300. That is, the first device D11 may be integrated in the first redistribution structure to reduce the communication paths between the devices as well as the occupied area of the first device D11, such that the performance of the package structure 1400 can be increased, and the size of the package structure 1000 can be reduced.

In some embodiments, the first redistribution structure of the redistribution structure 200E may include dummy patterns 204 disposed in the first dielectric layer 201 and a wiring layer 206 disposed on the first dielectric layer 201 and electrically connected to the first wiring pattern 202. In some embodiments, the dummy patterns 204 may be electrically isolated from the conductive connectors 102 of the connection member 100a. The dummy patterns 204 may be configured to adjust the degree of planarization of the first dielectric layer 201. For example, in the case where the first device D11 includes an inductor structure, the dummy patterns 204 can be configured to adjust the degree of planarization of the first dielectric layer 201 being greater than about 95%, such that the inductor structure (i.e., first device D11) disposed on the first dielectric layer 201 would be able to avoid the problem of electrical abnormality caused by an uneven wiring pattern. In some embodiments, the process of forming the inductor structure may be integrated in the process of forming the wiring layer 206. For example, the wiring layer 206 may include wirings 206a and 206b formed on the first dielectric layer 201. The wiring 206a may be disposed around the wiring 206b and may include a portion electrically connected to the first wiring pattern 202. The wiring 206b may be formed in a pattern as shown in FIG. 1(d) as the inductor structure.

In some embodiments, the redistribution structure 200E may further include a second redistribution structure disposed on the first redistribution structure. The second redistribution structure may include a second dielectric layer 203, a second wiring patterns 210, and a second device D22. The second dielectric layer 203 may be disposed on the first dielectric layer 201 and may cover the wiring layer 206. The second device D22 may be disposed on a portion of the second dielectric layer 203 where the first device D11 is disposed thereunder and may be electrically connected to the first device D11.

In some embodiments, the pattern of the wiring 206b for forming the first device D11 may adjust the degree of planarization of the second dielectric layer 203. For example, in the case where the second device D22 includes a capacitor structure, the wiring 206b may be configured to adjust the degree of planarization of the second dielectric layer 203 ranging from about 40% to about 60%, such that the second dielectric layer 203 is formed to include convex portions located on the wiring 206b and concave portions located between two neighboring patterns of the wiring 206b. In other words, the second dielectric layer 203 may have a trench structure without performing a process of forming a trench, so the trench structure may be also referred to as self-formed trench structure. As such, the capacitor (i.e., second device D22) formed on the convex portions and the concave portions of the second dielectric layer 203 may have an improved effective capacitance area and thus the occupied area of the second device D22 in the package structure 1400 can be decreased. In some embodiments, the occupied area of the second device D22 in the package structure 1400 can be decreased about 10% to about 30% by the forgoing designs.

In some embodiments, the second redistribution structure may include a third dielectric layer 205, a wiring layer 212, a third wiring pattern 216, pads 218, and solder balls 200. The third dielectric layer 205 may cover the second device D22 and the second wiring patterns 210. The wiring layer 212 may be formed on the second wiring patterns 210 and may be electrically connected to the second device D22. The third wiring pattern 216 may include vias formed in the third dielectric layer 205 and wiring layers formed on the third dielectric layer 205. In some embodiments, the third wiring pattern 216 may be electrically connected to the second wiring patterns 210 through the wiring layer 212. The pads 218 may be formed on the third wiring pattern 216 and may be electrically connected to the third wiring pattern 216. The solder balls 200 may be formed on the pads 218 and may be electrically connected to the pads 218. In some embodiments, the second redistribution structure may include a third device (e.g., the third device D3 shown in FIG. 13(*b*)) disposed in the third dielectric layer 205, and the third device may be electrically connected to the second device D2 through the second wiring patterns 210. In some embodiments, the third device D3 may include an antenna device, but the disclosure is not limited thereto.

In some embodiments, the capacitor structure may include compensation structures 208 filled in the concave portions of the second dielectric layer 203 to adjust the degree of planarization of the layer (e.g., the third dielectric layer 205) formed thereon. For example, the compensation structures 208 make the degree of planarization of the third dielectric layer 205 located on the compensation structures 208 greater than about 95%. As such, the wiring pattern (e.g., third wiring pattern 216) disposed on the portion of the third dielectric layer 205 where the compensation structures 208 disposed thereunder would be able to avoid the problem of electrical abnormality caused by an uneven wiring pattern.

Figure 6A:
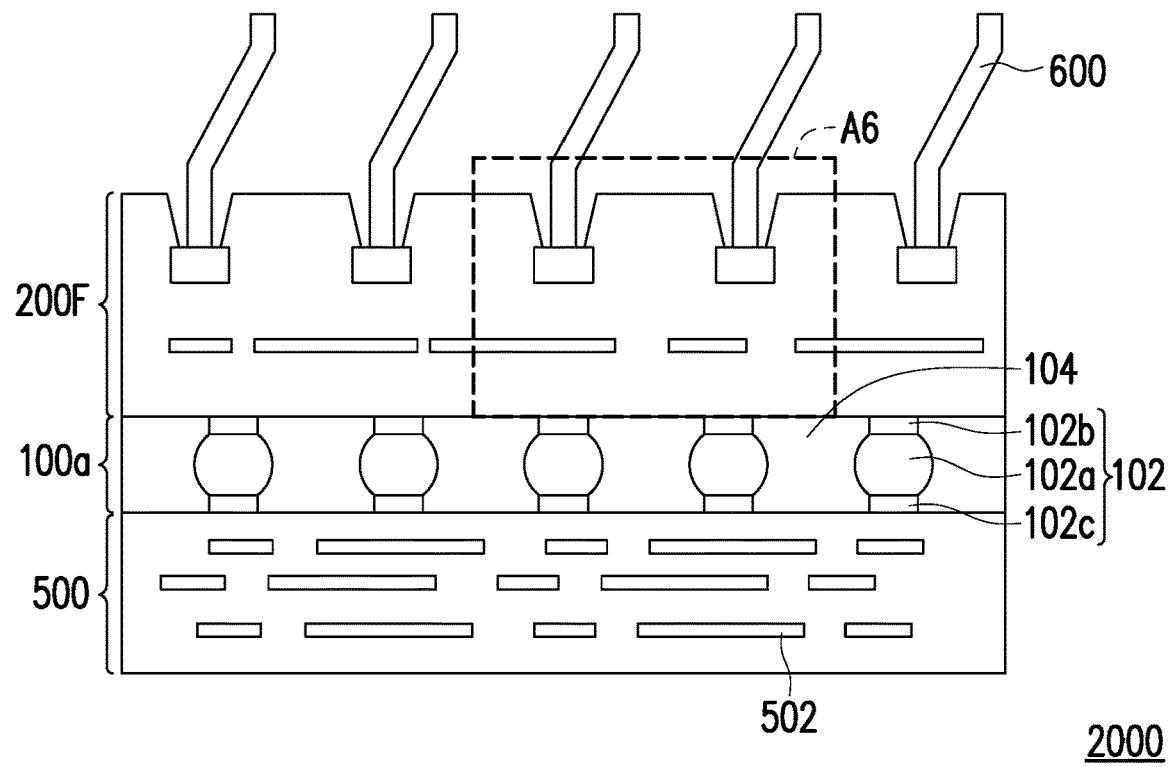
FIG. 6(a) is a schematic cross-section view illustrating a package structure of the sixth embodiment of the present disclosure.
Figure 6B:
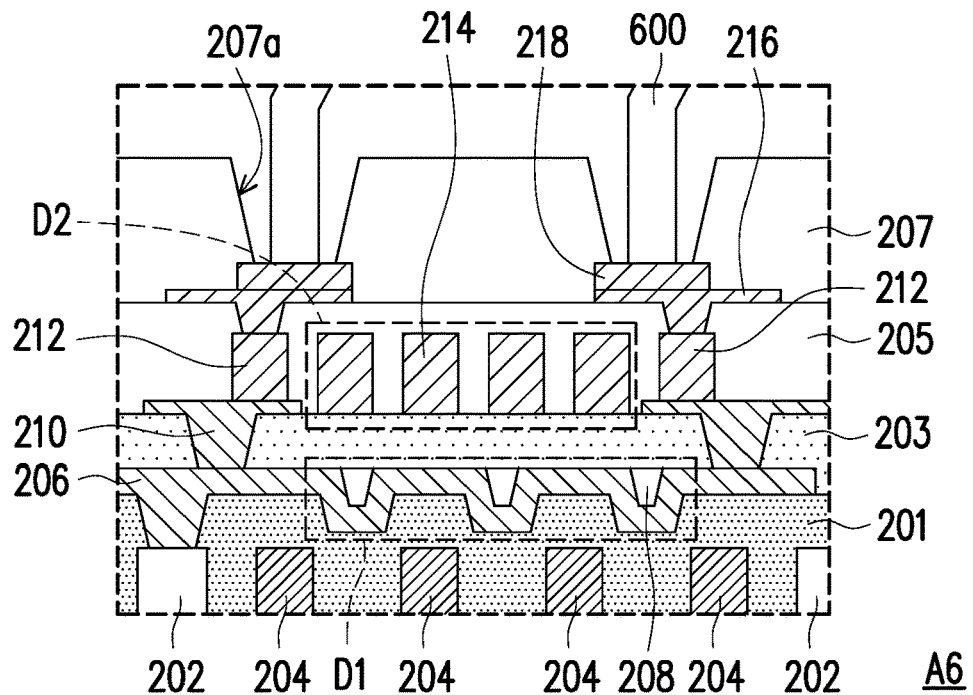
FIG. 6(b) is an enlarged schematic view of the region A6 in FIG. 6(a).

FIG. 6(*a*) is a schematic cross-section view illustrating a package structure of the sixth embodiment of the present disclosure. FIG. 6(*b*) is an enlarged schematic view of the region A6 in FIG. 6(*a*). A package structure 2000 shown in FIG. 6(*a*) is similar to the package structure 1000 shown in FIG. 1(*a*). The main difference therebetween is that the package structure 2000 is applied to a probe card (hereinafter a probe card 2000), so the redistribution structure 300 and the integrated circuit structure 400 of the package structure 1000 are not shown in FIG. 6(*a*), whereas the probe card 2000 include a substrate 500 and conductive probes 600. Other identical or similar components/layers/patterns are denoted by the same or similar reference numerals, which are not repeated herein.

Referring to FIG. 6(*a*) and FIG. 6(*b*), the probe card 2000 may include a connection member 100*a*, a redistribution structure 200F, a substrate 500, and conductive probes 600.

The connection member 100*a* includes conductive connectors 102 and an insulation layer 104 surrounding the conductive connectors 102. In some embodiments, the conductive connectors 102 may include electrical connection structures 102*a*, pads 102*b*, and pads 102*c*. The pads 102*b* connect ones ends of the electrical connection structures 102*a* to the redistribution structure 200F. The pads 102*c* connect other ends of the electrical connection structures 102*a* to the substrate 500.

The redistribution structure 200F is disposed on a first side of the connection member 100*a*. In some embodiments, the redistribution structure 200F may include a first redistribution structure. The first redistribution structure may include a first dielectric layer 201, a first wiring pattern 202, and a first device D1. The first dielectric layer 201 may be disposed on the connection member 100*a*. The first wiring pattern 202 may be disposed in the first dielectric layer 201. The first device D1 may be disposed above the first dielectric layer 201 and may be electrically connected to the conductive connector 102 of the connection member 100*a*. The first device D1 may be electrically connected to the substrate 500 through the first wiring pattern 202, the connection member 100*a*. That is, the first device D1 may be integrated in the first redistribution structure of the redistribution structure 200F to reduce the lengths of the communication paths between the devices as well as the occupied area of the first device D1, such that the performance of the probe card 2000 can be increased, and the size of the probe card 2000 can be reduced.

In some embodiments, the first redistribution structure may include dummy patterns 204 disposed in the first dielectric layer 201. In some embodiments, the dummy patterns 204 may be electrically isolated from the conductive connectors 102 of the connection member 100*a*. The dummy patterns 204 may adjust the degree of planarization of the first dielectric layer 201. For example, in the case where the first device D1 includes capacitor structure, the dummy patterns 204 may be configured to adjust the degree of planarization of the first dielectric layer 201 ranging from about 40% to about 60%, such that the first dielectric layer 201 is formed to include convex portions located on the dummy patterns 204 and concave portions located between two neighboring dummy patterns 204. In other words, the first dielectric layer 201 may have a trench structure without performing a process of forming a trench, so the trench structure may be also referred to as self-formed trench structure. As such, the capacitor (i.e., first device D1) formed on the convex portions and the concave portions of the first dielectric layer 201 may have an improved effective capacitance area and thus the occupied area of the first device D1 in the probe card 2000 can be decreased. In some embodiments, the occupied area of the first device D1 in the probe card 2000 can be decreased about 10% to about 30% by the forgoing designs.

In some embodiments, the first redistribution structure may include a wiring layer 206 disposed on the first dielectric layer 201 and electrically connected to the first wiring pattern 202. In some embodiments, the wiring layer 206 may be electrically connected to the capacitor structure. In some embodiments, the process of forming the capacitor structure may be integrated in the process of forming the wiring layer 206.

In some embodiments, the capacitor structure may include compensation structures 208 filled in the concave portions of the first dielectric layer 201 to adjust the degree of planarization of the layer (e.g., the second dielectric layer 203) formed thereon.

In some embodiments, the redistribution structure 200F may further include a second redistribution structure disposed on the first redistribution structure. The second redistribution structure may include a second dielectric layer 203, second wiring patterns 210, and a second device D2. The second dielectric layer 203 may be disposed on the first dielectric layer 201 and may cover the wiring layer 206 and the first device D1. The second wiring patterns 210 may include vias disposed in the second dielectric layer 203 and wiring layers disposed on the second dielectric layer 203. The second device D2 may be disposed on the portion of the second dielectric layer 203 where the compensation structures 208 are disposed thereunder and may be electrically connected to the first device D1.

In some embodiments, in the case where the second device D2 includes an inductor structure, the compensation structures 208 make the degree of planarization of the second dielectric layer 203 located on the compensation structures 208 greater than about 95%. As such, the inductor structure disposed on the portion of the second dielectric layer 203 where the compensation structures 208 disposed thereunder would be able to avoid the problem of electrical abnormality caused by an uneven wiring pattern. In some embodiments, the process of forming the inductor structure may be integrated in the process of forming the wiring layers in the second redistribution structure. For example, the second redistribution structure may include wiring layer 212 and wiring layer 214 that form on the second wiring patterns 210. The wiring layer 212 may be disposed around the wiring layer 214 and may include a portion electrically connected to the second wiring patterns 210. The wiring layer 214 may be formed in a pattern as shown in FIG. 1(d) as the inductor structure. In some embodiments, the wiring layer 212 may include a portion electrically connected to the capacitor structure (i.e., first device D1) and a portion electrically connected to the inductor structure (i.e., second device D2). In some embodiments, the portion of the wiring layer 212 that are electrically connected to the capacitor structure is spaced apart from the inductor structure (i.e., second device D2) by at least 10 μm to reduce the electrical loss of the inductor. For example, in the case where the first device D1 is a capacitor structure and where the second device D2 is an inductor structure, the portion of the wiring layer 212 electrically connected to the first device D1 (e.g., the portion of the wiring layer 212 being configured at the right side of the second device D2 in FIG. 6(b)) is spaced apart laterally from the inductor structure (i.e., second device D2) at least 10 μm when viewing from top, for example.

In some embodiments, the second redistribution structure may include a third dielectric layer 205, a third wiring pattern 216, and pads 218. The third dielectric layer 205 may cover the second device D2 and the second wiring patterns 210. The third wiring pattern 216 may include vias formed in the third dielectric layer 205 and wiring layers formed on the third dielectric layer 205. In some embodiments, the third wiring pattern 216 may be electrically connected to the second wiring patterns 210 through the wiring layer 212. The pads 218 may be formed on the third wiring pattern 216 and may be electrically connected to the third wiring pattern 216.

The conductive probes 600 may be disposed above the redistribution structure 200F and may be electrically connected to the first device D1. For example, the conductive probes 600 may be bonded to the pads 218 and may be electrically connected to the first device D1 through the pads 218, the third wiring pattern 216, the wiring layer 212, and the second wiring patterns 210. In some embodiments, the second redistribution structure may include a fourth dielectric layer 207 disposed on the third dielectric layer 205. The fourth dielectric layer 207 may include openings 207a that expose the pads 218, and the conductive probes 600 may be disposed in the openings 207a and may contact the pads 218 exposed by the openings 207a. As such, the measuring range of the conductive probes 600 can be confined.

The substrate 500 may be disposed on a second side of the connection member 100a that is opposite to the first side. Wiring patterns 502 of the substrate 500 may be electrically connected to the first device D1 in the first redistribution structure of the redistribution structure 200F through the connection member 100a. In some embodiments, the substrate 500 may include a multi-layer organic substrate (MLO substrate).

Figure 7A:
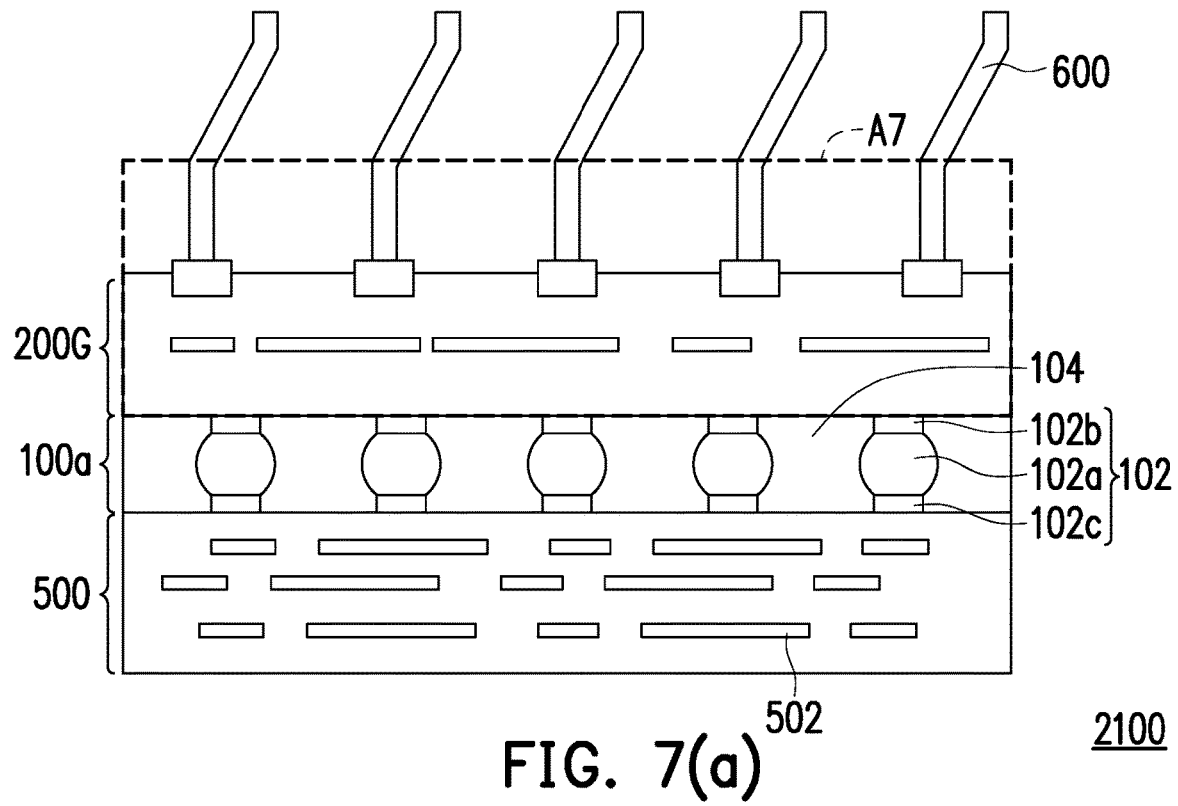
FIG. 7(a) is a schematic cross-section view illustrating a package structure of the seventh embodiment of the present disclosure.
Figure 7B:
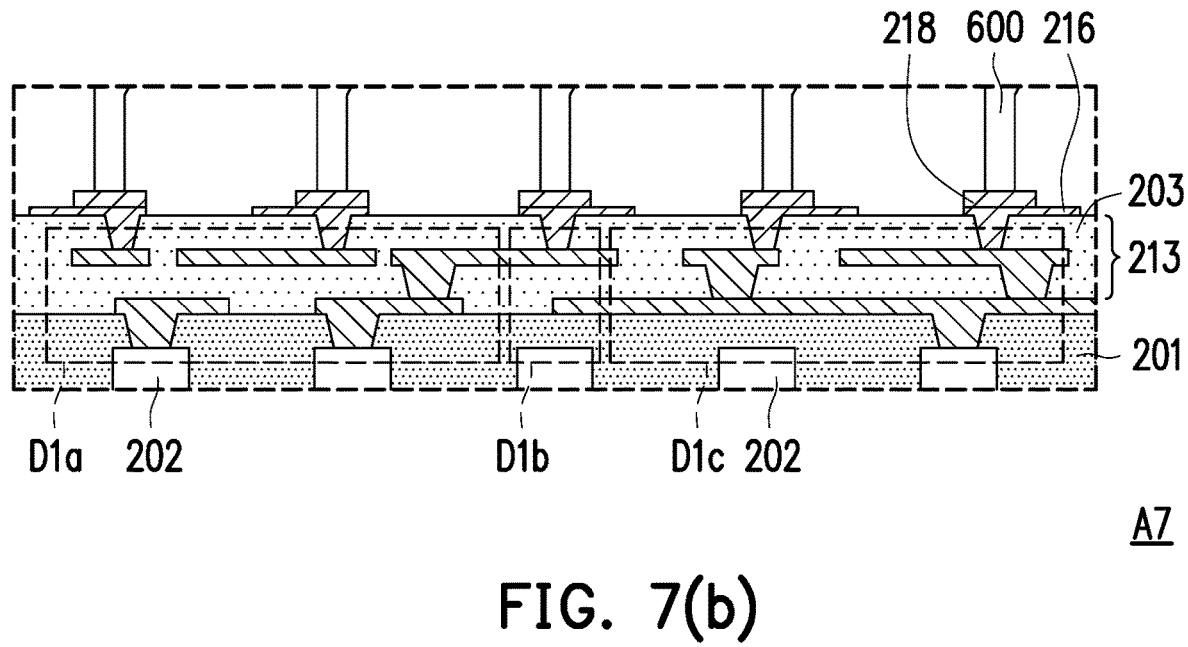
FIG. 7(b) is an enlarged schematic view of the region A7 in FIG. 7(a).

FIG. 7(a) is a schematic cross-section view illustrating a package structure of the seventh embodiment of the present disclosure. FIG. 7(b) is an enlarged schematic view of the region A7 in FIG. 7(a). A package structure 2100 shown in FIG. 7(a) is similar to the package structure 2000 shown in FIG. 6(a), which are both applied to the probe card (hereinafter probe card 2100 and probe card 2000). The main difference between the probe card 2100 and the probe card 2000 is that the probe card 2100 includes first devices D1a, D1b, and D1 that are applied to different regions. Other identical or similar components/layers/patterns are denoted by the same or similar reference numerals, which are not repeated herein.

Referring to FIG. 7(a) and FIG. 7(b), the redistribution structure 200G of the probe card 2100 may be disposed on the connection member 100a and may include a first dielectric layer 201, a second dielectric layer 203, a first wiring pattern 202, first devices D1a, D1b, and D1c, second wiring patterns 213, a third wiring pattern 216, and pads 218. The second dielectric layer 203, the first wiring pattern 202, the third wiring pattern 216, and the pads 218 are described in detail in the foregoing embodiments, which are not repeated herein.

The first dielectric layer 201 may be a planarization layer (hereinafter planarization layer 201), thereby forming the dummy patterns 204 in the planarization layer 201 may be omitted. In this embodiment, the material of the planarization layer 201 may be different from the material of the second dielectric layer 203. In some embodiments, the degree of planarization of the planarization layer 201 is greater than about 95%, such that the first devices D1a, D1b, and D1c disposed on the planarization layer 201 would be able to avoid the problem of electrical abnormality caused by an uneven wiring pattern.

The first devices D1a, D1b, and D1c may be disposed above the planarization layer 201. The second wiring patterns 213 may include vias disposed in the planarization layer 201 and wiring layer disposed on the planarization layer 201 and vias and wiring layers disposed in the second dielectric layer 203. In some embodiments, the process of forming the first devices D1a, D1b, and D1c may be integrated in the process of forming the second wiring patterns 213. For example, the first device D1a, D1b, or D1c may be, for example, a high-frequency device composed of wirings in the second wiring patterns 213. In some embodiments, the first devices D1a, D1b, and D1c may be configured in different circuit regions of the redistribution structure 200G. For example, the first device D1a may be configured in a fan-out circuit region; the first device D1b may be configured in a matching circuit region; and the first device D1c may be configured in a mm-Wave circuit region.

Figure 8A:
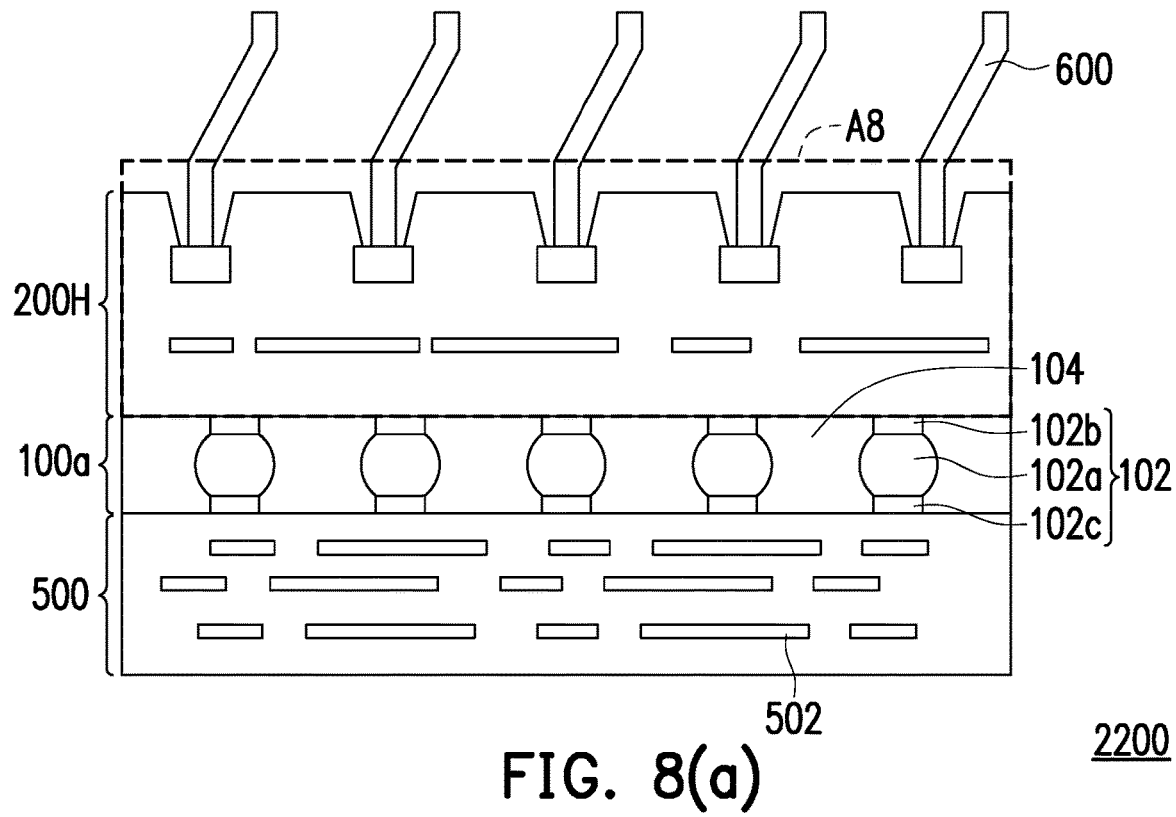
FIG. 8(a) is a schematic cross-section view illustrating a package structure of the eighth embodiment of the present disclosure.
Figure 8B:
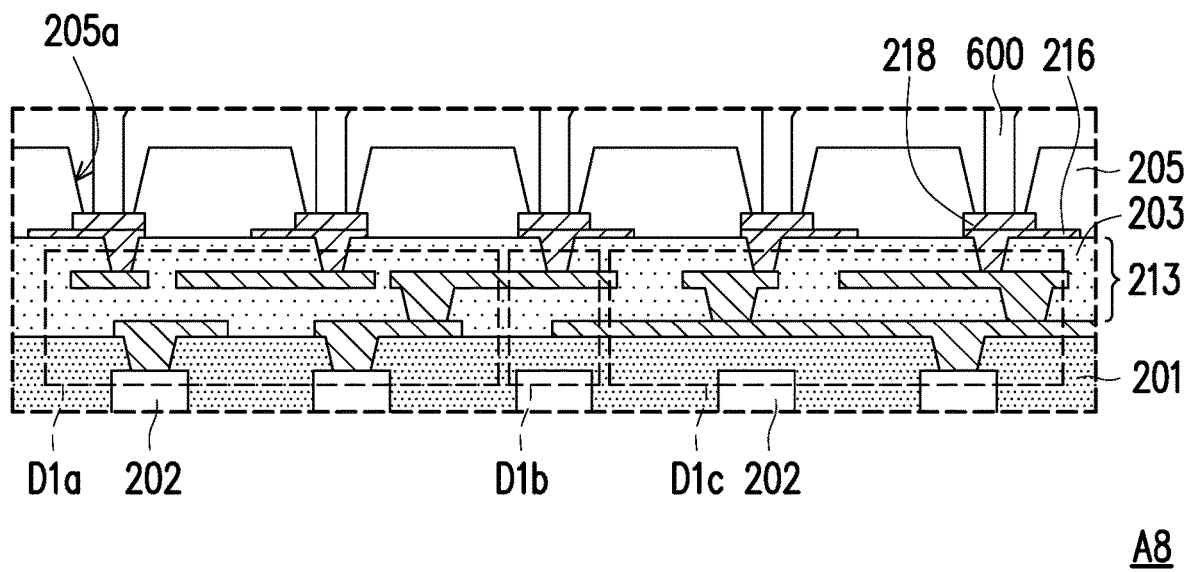
FIG. 8(b) is an enlarged schematic view of the region A8 in FIG. 8(a).

FIG. 8(a) is a schematic cross-section view illustrating a package structure of the eighth embodiment of the present disclosure. FIG. 8(b) is an enlarged schematic view of the region A8 in FIG. 8(a). A package structure 2200 shown in FIG. 8(a) is similar to the package structure 2100 shown in FIG. 7(a), which are both applied to the probe card (hereinafter probe card 2200 and probe card 2100). The main difference between the probe card 2200 and the probe card 2100 is that the redistribution structure 200H of the probe card 2200 includes a third dielectric layer 205 disposed on the second dielectric layer 203. Other identical or similar components/layers/patterns are denoted by the same or similar reference numerals, which are not repeated herein.

Referring to FIG. 8(a) and FIG. 8(b), the redistribution structure 200H of the probe card 2200 may include a third dielectric layer 205 disposed on the second dielectric layer 203. The third dielectric layer 205 may include openings 205a that expose the pads 218, and the conductive probes 600 are disposed in the openings 205a and may contact the pads 218 exposed by the openings 205a. As such, the measuring range of the conductive probes 600 can be confined.

Figure 9A:
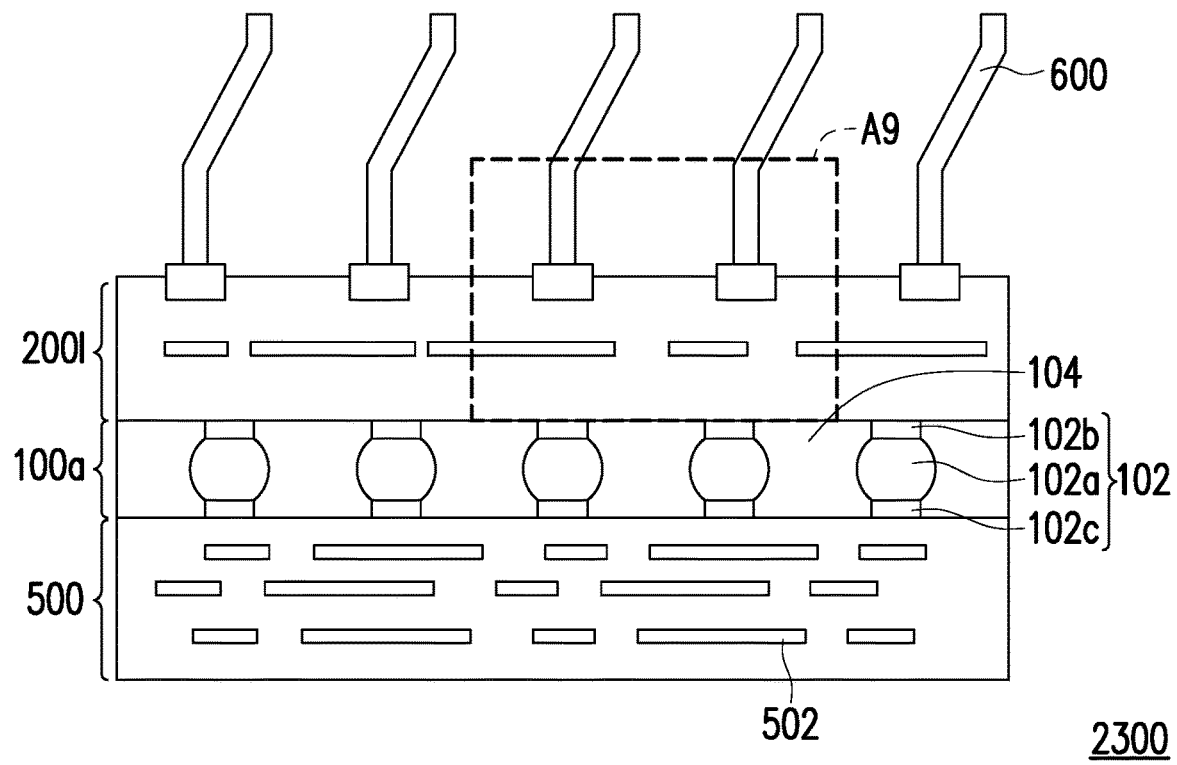
FIG. 9(a) is a schematic cross-section view illustrating a package structure of the ninth embodiment of the present disclosure.
Figure 9B:
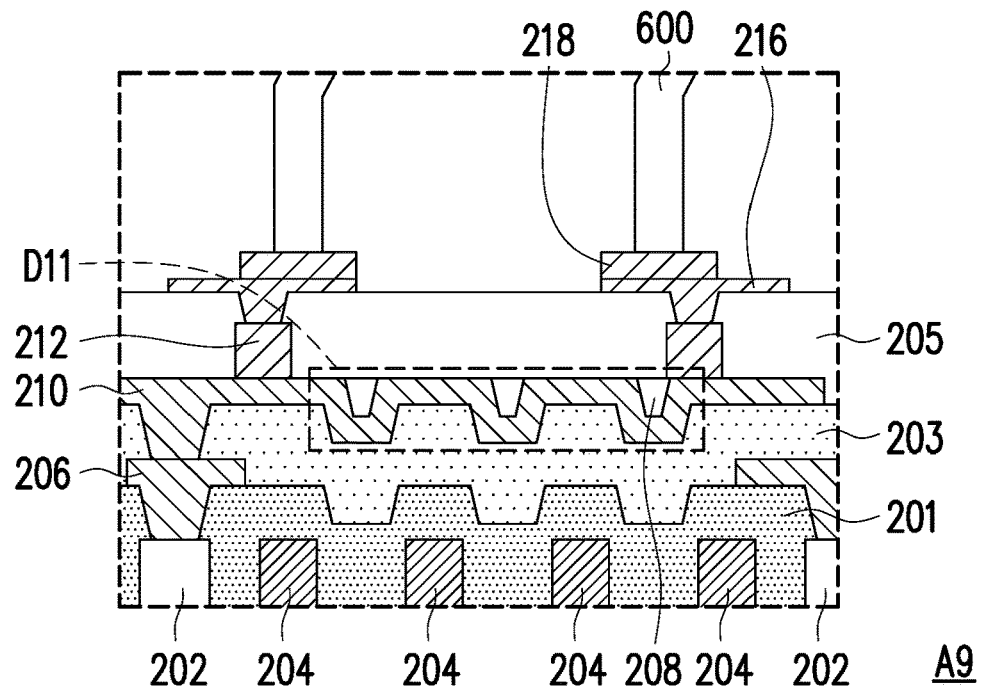
FIG. 9(b) is an enlarged schematic view of the region A9 in FIG. 9(a).

FIG. 9(a) is a schematic cross-section view illustrating a package structure of the ninth embodiment of the present disclosure. FIG. 9(b) is an enlarged schematic view of the region A9 in FIG. 9(a). A package structure 2300 shown in FIG. 9(a) is similar to the package structure 2000 shown in FIG. 6(a), which are both applied to the probe card (hereinafter probe card 2300 and probe card 2000). The main difference between the probe card 2300 and the probe card 2000 is that the location of the first device D11 in the redistribution structure 2001 of the probe card 2300 is different from the location of the first device D1 in the redistribution structure 200F of the probe card 2000. Other identical or similar components/layers/patterns are denoted by the same or similar reference numerals, which are not repeated herein.

Referring to FIG. 9(a) and FIG. 9(b), the redistribution structure 2001 is disposed on the connection member 100a. In some embodiments, the redistribution structure 2001 may include a first redistribution structure. The first redistribution structure may include a first dielectric layer 201, a first wiring pattern 202, and a first device D11. The first dielectric layer 201 may be disposed on the connection member 100a. The first wiring pattern 202 may be disposed in the first dielectric layer 201. The first device D11 may be disposed above the first dielectric layer 201 and may be electrically connected to the conductive connector 102 of the connection member 100a. The first device D11 may be electrically connected to the wiring patterns 502 in the substrate 500 through the first wiring pattern 202 and the connection member 100a. That is, the first device D11 may be integrated in the first redistribution structure of the redistribution structure 2001 to reduce the lengths of the communication paths between the devices as well as the occupied area of the first device D11, such that the performance of the probe card 2300 can be increased, and the size of the probe card 2300 can be reduced.

In some embodiments, the first redistribution structure may include dummy patterns 204, a wiring layer 206, a second dielectric layer 203m and second wiring patterns 210. The dummy patterns 204 may be disposed in the first dielectric layer 201 and may be electrically isolated from the conductive connectors 102 of the connection member 100a. The wiring layer 206 may be disposed on the first dielectric layer 201 and may be electrically connected to the first wiring pattern 202. The second dielectric layer 203 may be formed on the first dielectric layer 201 and may cover the wiring layer 206. The second wiring patterns 210 may be formed on the second dielectric layer 203.

In some embodiments, in the case where the first device D11 is disposed on the second dielectric layer 203 (as shown in FIG. 9(b)), the dummy patterns 204 may be used to adjust the degree of planarization of the first dielectric layer 201 and the degree of planarization of the second dielectric layer 203. For example, in the case where the first device D11 includes a capacitor structure, the dummy patterns 204 may be configured to adjust the degree of planarization of the first dielectric layer 201 ranging from about 40% to about 60%, such that the first dielectric layer 201 is formed to include convex portions located on the dummy patterns 204 and concave portions located between two neighboring dummy patterns 204, and the second dielectric layer 203 formed on the first dielectric layer 201 may be also formed to include convex portions located above the dummy patterns 204 (corresponding to the locations of the convex portions of the first dielectric layer 201) and concave portions located between two neighboring dummy patterns 204 (corresponding to the locations of the concave portions of the first dielectric layer 201). In other words, both the first dielectric layer 201 and the second dielectric layer 203 may have trench structures without performing a process of forming a trench, so the trench structures may be also referred to as self-formed trench structures. As such, the capacitor (i.e., first device D11) formed on the convex portions and the concave portions of the second dielectric layer 203 may have an improved effective capacitance area and thus the occupied area of the first device D11 in the probe card 2300 can be decreased. In some embodiments, the occupied area of the first device D11 in the probe card 2300 can be decreased about 10% to about 30% by the forgoing designs. In some embodiments, the process of forming the inductor structure may be integrated in the process of forming the second wiring patterns 210. In some embodiments, the capacitor structure may include compensation structures 208 filled in the concave portions of the second dielectric layer 203 to adjust the degree of planarization of the layer (e.g., the third dielectric layer 205) formed thereon.

In some embodiments, the redistribution structure 2001 may further include a second redistribution structure disposed on the first redistribution structure. The second redistribution structure may include a third dielectric layer 205, a wiring layer 212, a third wiring pattern 216, and pads 218. The third dielectric layer 205 may cover the first device D11 and the second wiring patterns 210. The wiring layer 212 may be formed on the second wiring patterns 210 and may be electrically connected to the first device D11. The third wiring pattern 216 may include vias formed in the third dielectric layer 205 and wiring layers formed on the third dielectric layer 205. In some embodiments, the third wiring pattern 216 may be electrically connected to the second wiring patterns 210 through the wiring layer 212. The pads 218 may be formed on the third wiring pattern 216 and may be electrically connected to the third wiring pattern 216.

In some embodiments, in the case where the capacitor structure include compensation structures 208, the compensation structures 208 can make the degree of planarization of the third dielectric layer 205 disposed on the compensation structures 208 greater than about 95%. As such, the wiring pattern (e.g., third wiring pattern 216) disposed on the portion of the second dielectric layer 205 where the compensation structures 208 is disposed thereunder would be able to avoid the problem of electrical abnormality caused by an uneven wiring pattern.

Figure 10A:
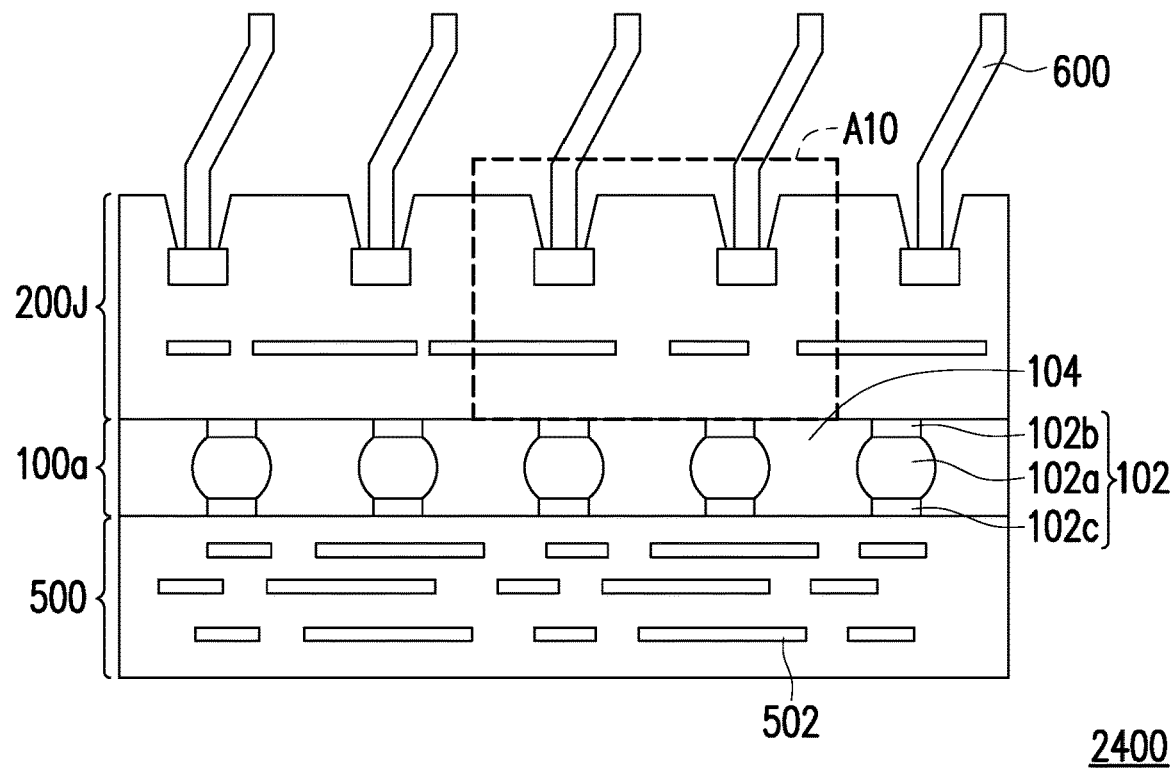
FIG. 10(a) is a schematic cross-section view illustrating a package structure of the tenth embodiment of the present disclosure.
Figure 10B:
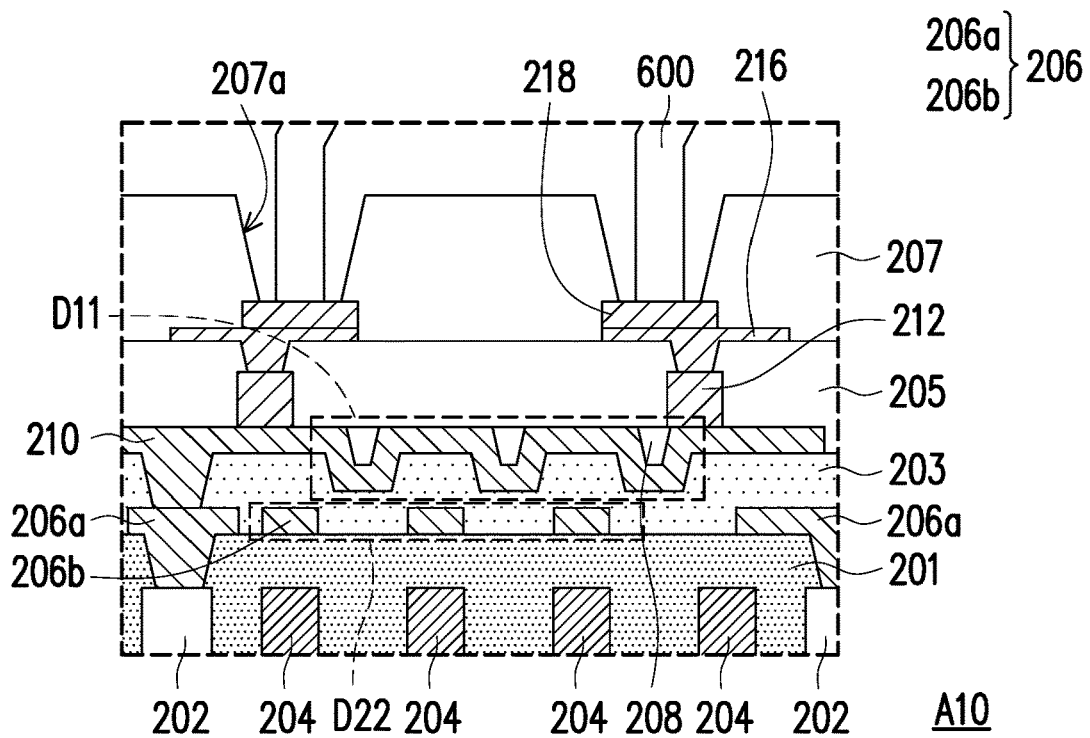
FIG. 10(b) is an enlarged schematic view of the region A10 in FIG. 10(a).

FIG. 10(a) is a schematic cross-section view illustrating a package structure of the tenth embodiment of the present disclosure. FIG. 10(b) is an enlarged schematic view of the region A10 in FIG. 10(a). A package structure 2400 shown in FIG. 10(a) is similar to the package structure 2300 shown in FIG. 9(a), which are both applied to the probe card (hereinafter probe card 2400 and probe card 2300). The main difference between the probe card 2400 and the probe card 2300 is that the redistribution structure 200J of the probe card 2400 further includes a second device D22 and a fourth dielectric layer 207. Other identical or similar components/layers/patterns are denoted by the same or similar reference numerals, which are not repeated herein.

Referring to FIG. 10(a) and FIG. 10(b), the first redistribution structure in the redistribution structure 200J may include a second device D22 disposed on the first dielectric layer 201. In some embodiments, in the case where the second device D22 includes an inductor structure, the dummy patterns 204 may be configured to adjust the degree of planarization of the first dielectric layer 201 being greater than about 95%, such that the inductor structure (i.e., second device D22) disposed on the first dielectric layer 201 would be able to avoid the problem of electrical abnormality caused by an uneven wiring pattern. In some embodiments, the process of forming the inductor structure may be integrated in the process of forming the wiring layer 206. For example, the wiring layer 206 may include wirings 206a and 206b formed on the first dielectric layer 201. The wiring 206a may be disposed around the wiring 206b and may include a portion electrically connected to the first wiring pattern 202. The wiring 206b may be formed in a pattern as shown in FIG. 1(d) as the inductor structure.

In some embodiments, the pattern of the wiring 206b for forming the second device D22 may adjust the degree of planarization of the second dielectric layer 203. For example, in the case where the first device D11 includes a capacitor structure, the wiring 206b may be configured to adjust the degree of planarization of the second dielectric layer 203 ranging from about 40% to about 60%, such that the second dielectric layer 203 is formed to include convex portions located on the wiring 206b and concave portions located between two neighboring patterns of the wiring 206b. As such, the capacitor structure (i.e., first device D11) formed on the convex portions and the concave portions of the second dielectric layer 203 may have an improved effective capacitance area and thus the occupied area of the first device D11 in the probe card 2400 can be decreased.

The second redistribution structure in the redistribution structure 200J may include a fourth dielectric layer 207 disposed on the third dielectric layer 205. The fourth dielectric layer 207 may include openings 207a that expose the pads 218, and the conductive probes 600 are disposed in the openings 207a and contact the pads 218 exposed by the openings 207a, such that the measuring range of the conductive probes 600 can be confined.

Figure 11A:
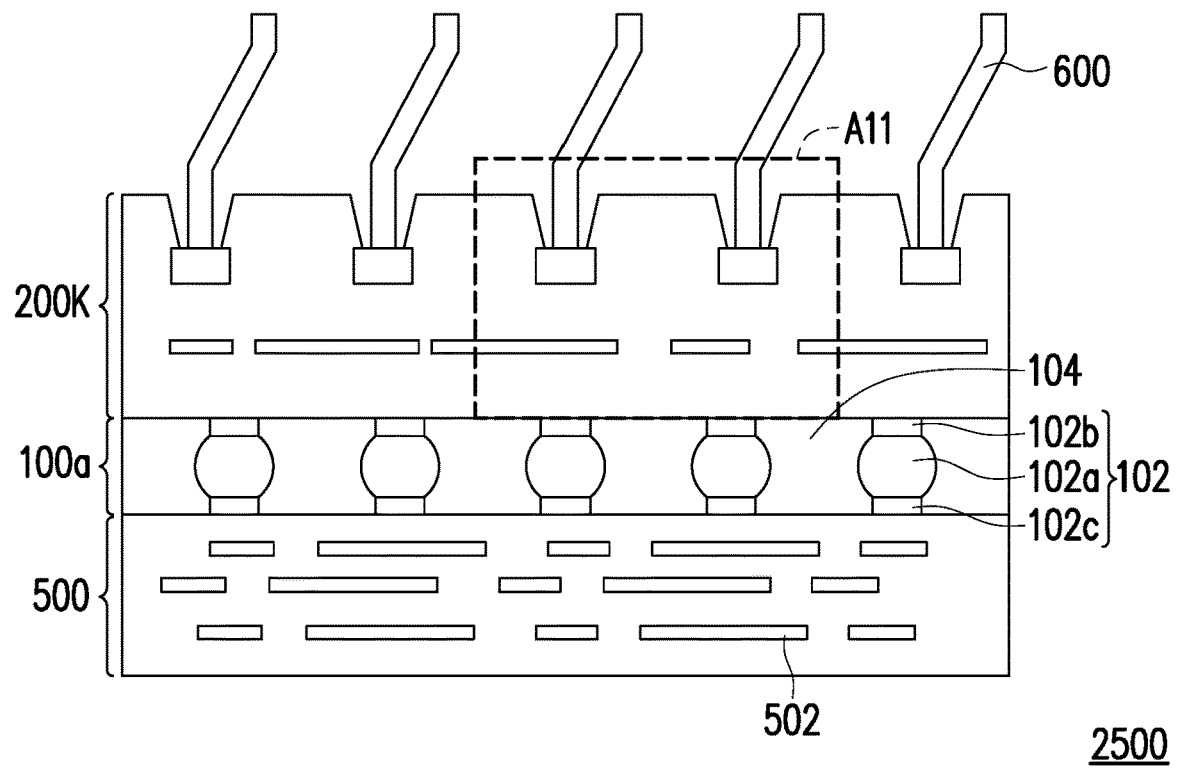
FIG. 11(a) is a schematic cross-section view illustrating a package structure of the eleventh embodiment of the present disclosure.
Figure 11B:
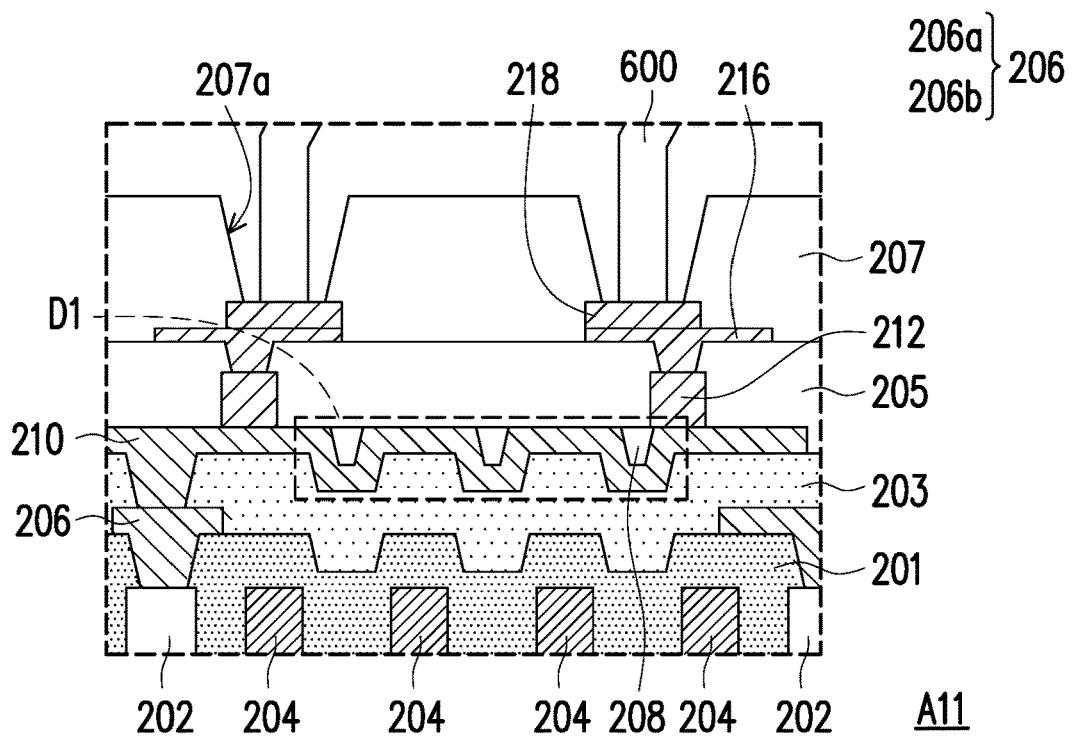
FIG. 11(b) is an enlarged schematic view of the region A11 in FIG. 11(a).

FIG. 11(a) is a schematic cross-section view illustrating a package structure of the eleventh embodiment of the present disclosure. FIG. 11(b) is an enlarged schematic view of the region A11 in FIG. 11(a). A package structure 2500 shown in FIG. 11(a) is similar to the package structure 2300 shown in FIG. 9(a), which are both applied to the probe card (hereinafter probe card 2500 and probe card 2300). The main difference between the probe card 2500 and the probe card 2300 is that the redistribution structure 200K of the probe card 2500 further includes a fourth dielectric layer 207. Other identical or similar components/layers/patterns are denoted by the same or similar reference numerals, which are not repeated herein.

Referring to FIG. 11(a) and FIG. 11(b), the second redistribution structure in the redistribution structure 200K of the probe card 2500 may include a fourth dielectric layer 207 disposed on the third dielectric layer 205. The fourth dielectric layer 207 may include openings 207a that expose the pads 218, and the conductive probes 600 are disposed in the openings 207a and contact the pads 218 exposed by the openings 207a, such that the measuring range of the conductive probes 600 can be confined.

Figure 12A:
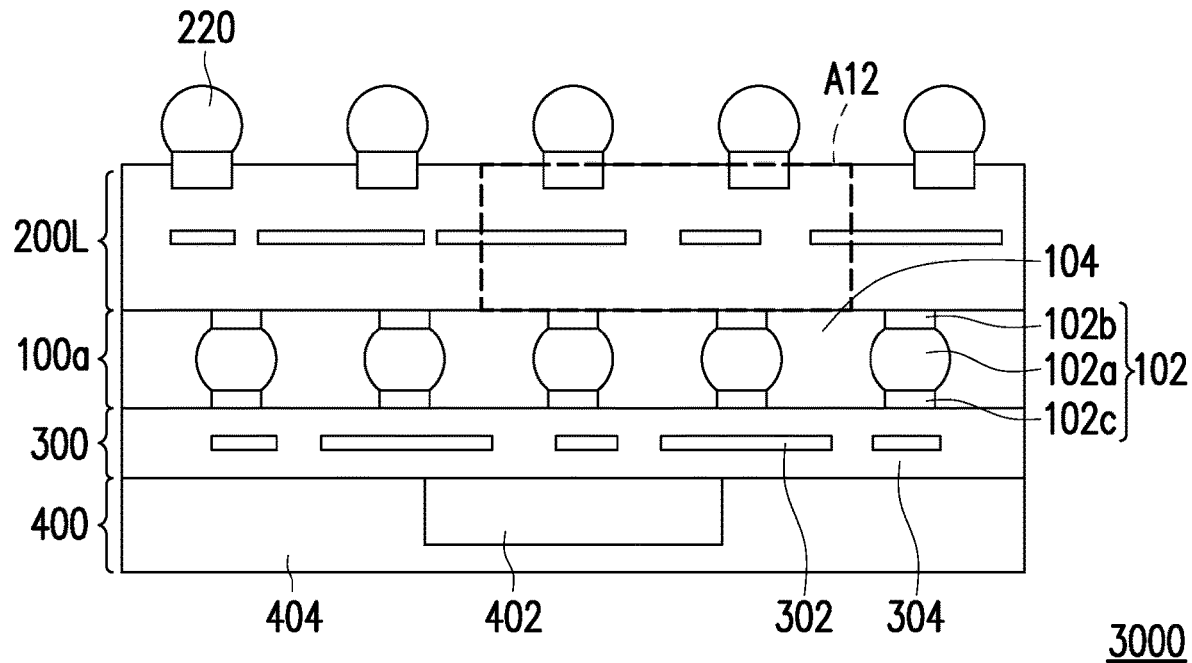
FIG. 12(a) is a schematic cross-section view illustrating a package structure of the twelfth embodiment of the present disclosure.
Figure 12B:
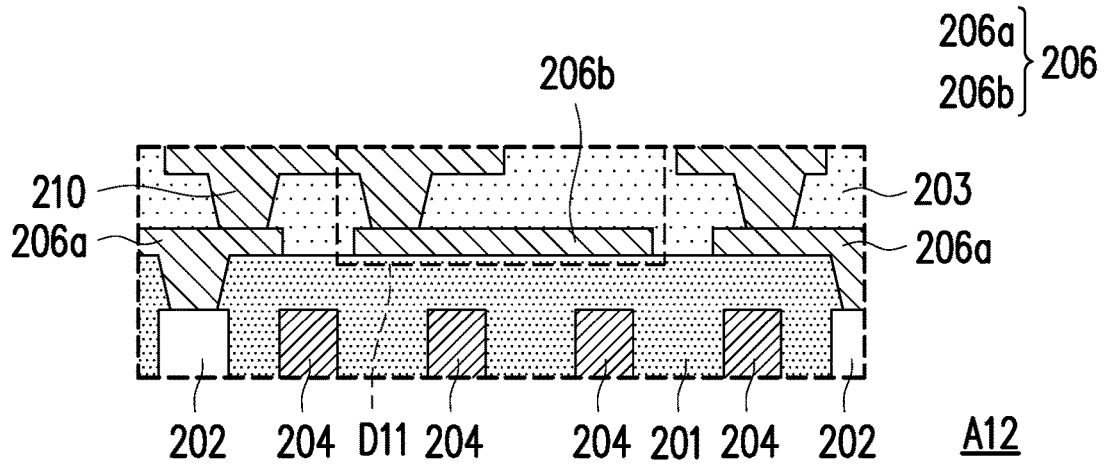
FIG. 12(b) is an enlarged schematic view of the region A12 in FIG. 12(a).

FIG. 12(a) is a schematic cross-section view illustrating a package structure of the twelfth embodiment of the present disclosure. FIG. 12(b) is an enlarged schematic view of the region A12 in FIG. 12(a). A package structure 3000 shown in FIG. 12(a) is similar to the package structure 1100 shown in FIG. 2(a). The main difference therebetween is that the package structure 3000 is applied to the antenna module (hereinafter antenna module 3000), such that the antenna device D11 in the redistribution structure 200L of the antenna module 3000 is different from the first device D1 of the package structure 1100 in terms of patterns and/or functions. Other identical or similar components/layers/patterns are denoted by the same or similar reference numerals, which are not repeated herein.

Referring to FIG. 12(a) and FIG. 12(b), the redistribution structure 200L of the antenna module 3000 may be disposed on a first side of the connection member 100a and may include a first redistribution structure. The first redistribution structure may include a first dielectric layer 201, a first wiring pattern 202, and an antenna device D11. The first wiring pattern 202 may be disposed on the first side of the connection member 100a and may be electrically connected to the conductive connector 102 of the connection member 100a. The first dielectric layer 201 may be disposed on the first side of the connection member 100a and may cover the first wiring pattern 202. The antenna device D11 may be disposed above the first dielectric layer 201 and may be configured to transmit and/or receive signals, wherein the antenna device D11 is electrically connected to the first wiring pattern 202. The antenna device D11 may be electrically connected to the integrated circuit 402 through the first wiring pattern 202, the connection member 100a, and the redistribution structure 300. That is, the antenna device D11 may be integrated in the first redistribution structure of the redistribution structure 200L to reduce the communication paths between the devices as well as the occupied area of the antenna device D11, such that the performance of the antenna module 3000 can be increased, and the size of the antenna module 3000 can be reduced. The antenna device D11 may include an active antenna, a passive antenna, or a combination thereof. In some embodiments, dielectric layers in the antenna module 3000 may use a transparent material such as a material used in a spin-on glass (SOG) process, so as to generate a transparent antenna structure.

In some embodiments, the first redistribution structure may include dummy patterns 204 disposed in the first dielectric layer 201 and a wiring layer 206 disposed on the first dielectric layer 201 and electrically connected to the first wiring pattern 202. In some embodiments, the dummy patterns 204 may be electrically isolated from the conductive connectors 102 of the connection member 100a. The dummy patterns 204 may adjust the degree of planarization of the first dielectric layer 201. For example, the dummy patterns 204 may be configured to adjust the degree of planarization of the first dielectric layer 201 being greater than about 95%, such that the antenna device D11 disposed on the first dielectric layer 201 would be able to avoid the problem of electrical abnormality caused by an uneven wiring pattern. In some embodiments, the process of forming the antenna device D11 may be integrated in the process of forming the wiring layer 206. For example, the wiring layer 206 may include wirings 206a and 206b formed on the first dielectric layer 201. The wiring 206a may be disposed around the wiring 206b and may include a portion electrically connected to the first wiring pattern 202. The pattern of the wiring 206b may form the antenna device D11.

In some embodiments, the redistribution structure 200L may further include a second redistribution structure disposed on the first redistribution structure. The second redistribution structure may include a second dielectric layer 203 and second wiring patterns 210. The second dielectric layer 203 may be disposed on the first dielectric layer 201 and may cover the wiring layer 206. The second wiring patterns 210 may be disposed in the second dielectric layer 203 and may electrically connect the antenna device D11 to the wiring layer 206.

Figure 13A:
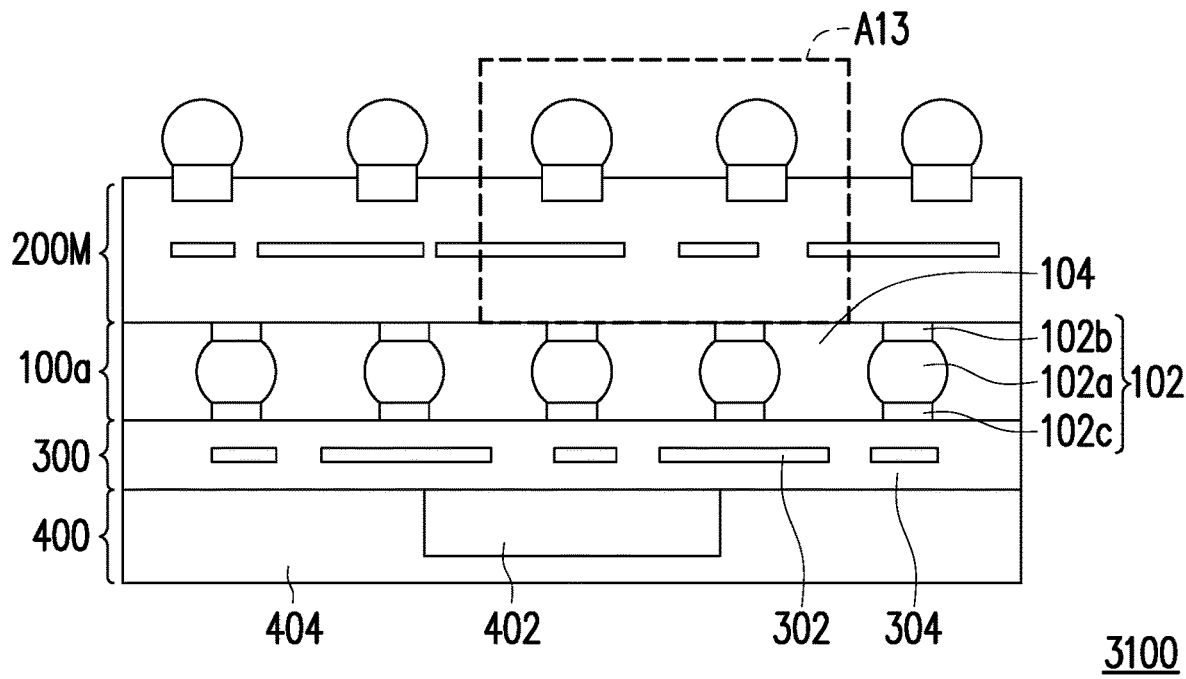
FIG. 13(a) is a schematic cross-section view illustrating a package structure of the thirteenth embodiment of the present disclosure.
Figure 13B:
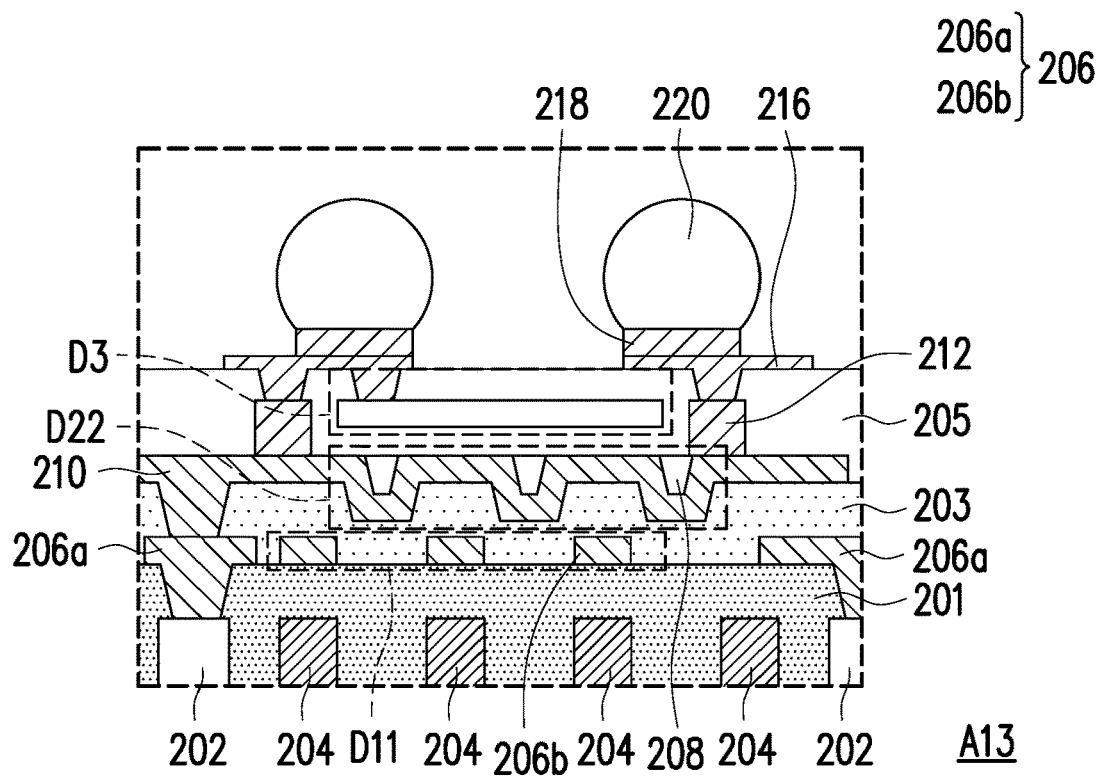
FIG. 13(b) is an enlarged schematic view of the region A13 in FIG. 13(a).

FIG. 13(a) is a schematic cross-section view illustrating a package structure of the thirteenth embodiment of the present disclosure. FIG. 13(b) is an enlarged schematic view of the region A13 in FIG. 13(a). A package structure 3100 shown in FIG. 13(a) is similar to the package structure 1400 shown in FIG. 5(a). The main difference therebetween is that the package structure 3100 is applied to the antenna module (hereinafter antenna module 3100), such that the redistribution structure 200M of the antenna module 3100 further includes an antenna device D3. Other identical or similar components/layers/patterns are denoted by the same or similar reference numerals, which are not repeated herein.

Referring to FIG. 13(a) and FIG. 13(b), as compared to the package structure 1400 shown in FIG. 5(a), the redistribution structure 200M of the antenna module 3100 further includes an antenna device D3 disposed in the third dielectric layer 205. The antenna device D3 is disposed above the second device D22 and is electrically connected to the second device D22 through the third wiring pattern 216, the wiring layer 212, and the second wiring patterns 210. In some embodiments, dielectric layers in the antenna module 3100 may use a transparent material such as a material used in a spin-on glass (SOG) process, so as to generate a transparent antenna structure.

Figure 14A:
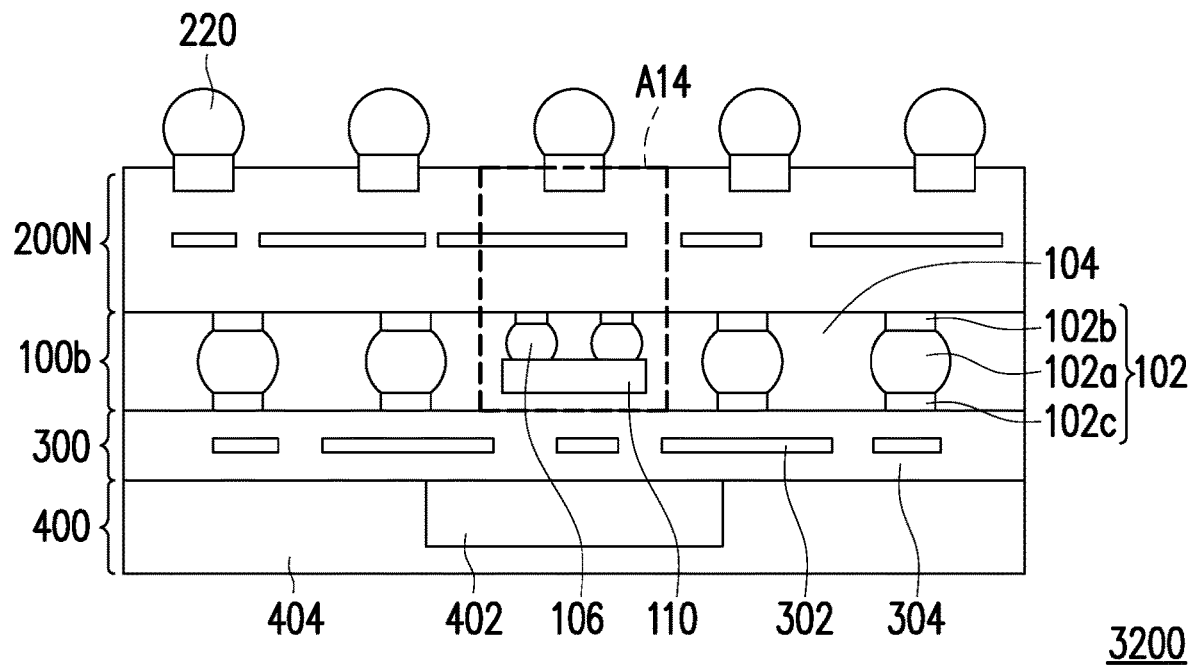
FIG. 14(a) is a schematic cross-section view illustrating a package structure of the fourteenth embodiment of the present disclosure.
Figure 14B:
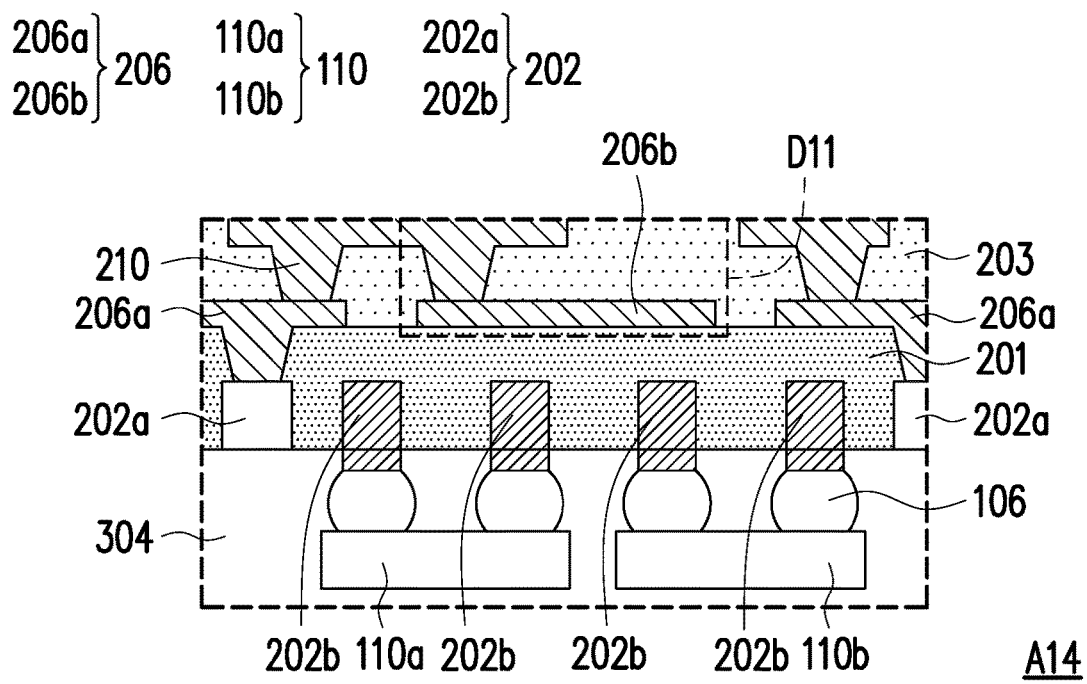
FIG. 14(b) is an enlarged schematic view of the region A14 in FIG. 14(a).

FIG. 14(a) is a schematic cross-section view illustrating a package structure of the fourteenth embodiment of the present disclosure. FIG. 14(b) is an enlarged schematic view of the region A14 in FIG. 14(a). A package structure 3200 shown in FIG. 14(a) is similar to the package structure 3000 shown in FIG. 12(a), which are both applied to the antenna module (hereinafter antenna module 3200 and antenna module 3000). The main difference between the antenna module 3200 and the antenna module 3000 is that the connection member 100b of the antenna module 3200 further includes a component 110 and the redistribution structure 200N of the antenna module 3200 is different from the redistribution structure 200L of the antenna module 3000. Other identical or similar components/layers/patterns are denoted by the same or similar reference numerals, which are not repeated herein.

Referring to FIG. 14(a) and FIG. 14(b), the connection member 100b of the antenna module 3200 includes conductive connectors 102, an insulation layer 104 surrounding the conductive connectors 102, a component 110 disposed in the insulation layer 104, and conductive connectors 106 electrically connected the component 110 to the redistribution structure 200N. In some embodiments, the component 110 include a first component 110a and a second component 110b. The first wiring pattern 202 of the redistribution structure 200N may include a wiring layer 202a electrically connected to the wiring layer 206 and a wiring layer 202b electrically connected to the first component 110a and the second component 110b. In some embodiments, the wiring layer 202b may adjust the degree of planarization of the first dielectric layer 201. For example, the wiring layer 202b may be configured to adjust the degree of planarization of the first dielectric layer 201 being greater than about 95%, such that the antenna device D11 disposed on the first dielectric layer 201 would be able to avoid the problem of electrical abnormality caused by an uneven wiring pattern. The first component 110a and the second component 110b may be electrically connected to the antenna device D11 and/or the integrated circuit 402.

Figure 15:
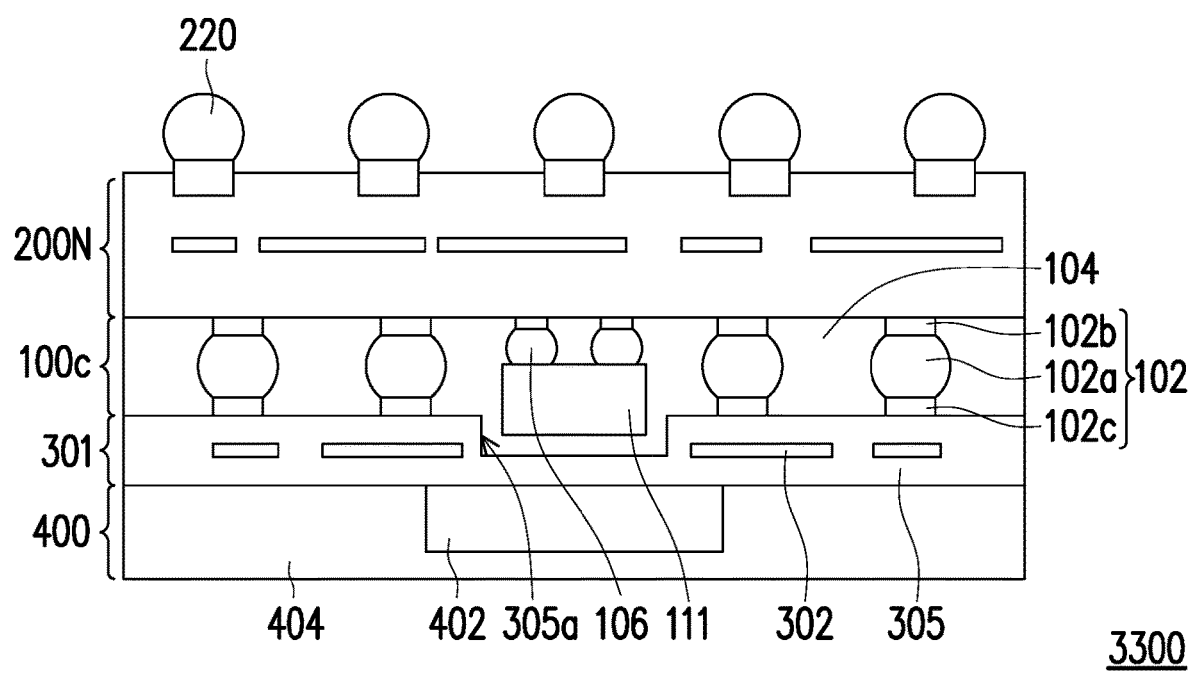
FIG. 15 is a schematic cross-section view illustrating a package structure of the fifteenth embodiment of the present disclosure.

FIG. 15 is a schematic cross-section view illustrating a package structure of the fifteenth embodiment of the present disclosure. A package structure 3300 shown in FIG. 15 is similar to the package structure 3200 shown in FIG. 14(a), which are both applied to the antenna module (hereinafter antenna module 3300 and antenna module 3200). The main difference between the antenna module 3300 and the antenna module 3200 is that the redistribution structure 301 of the antenna module 3300 is different from the redistribution structure 300 of the antenna module 3200 and the size of the component 111 in the connection member 100c is different from the size of the component 110 in the connection member 100b. Other identical or similar components/layers/patterns are denoted by the same or similar reference numerals, which are not repeated herein.

Referring to FIG. 15, the redistribution structure 301 of the antenna module 3300 may include a redistribution layer 302 and an insulation layer 305. The redistribution layer 302 may be formed in the insulation layer 305, and the insulation layer 305 may include a groove 305a to accommodate the component 111 of the connection member 100c. As such, the component 111 with large size can be embedded in the connection member 100c while maintaining the thickness of the antenna module 3300.

Based on the above, in the package structure, the antenna module, and the probe card as described above in the disclosure, the device such as an active device or a passive device is designed to integrate into the redistribution structure to reduce the communication paths between the devices as well as the occupied area of the active/passive device, thereby improving the device performance and reducing the device size.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
a connection member comprising a conductive connector and an insulation layer surrounding the conductive connector; and
a first redistribution structure disposed on the connection member and comprising:
a first dielectric layer disposed on the connection member;
first wiring pattern disposed in the first dielectric layer;
a first device disposed above the first dielectric layer and electrically connected to the conductive connector; and
dummy patterns, wherein the dummy patterns are disposed in the first dielectric layer and electrically isolated from the conductive connector.

2. The package structure of claim 1, wherein the dummy patterns are configured to make a degree of planarization of the first dielectric layer ranging from about 40% to about 60%, so that the first dielectric layer comprises convex portions located on the dummy patterns and concave portions located between two neighboring dummy patterns, and the first device is disposed on the convex portions and the concave portions of the first dielectric layer.

3. The package structure of claim 2, wherein the first device comprises a capacitor structure, and the capacitor structure comprises:
a first electrode disposed on surfaces of the convex portions and the concave portions of the first dielectric layer;
a dielectric disposed on the first electrode;
a second electrode disposed on the dielectric; and
compensation structures disposed on the second electrode and being filled into the concave portions of the first dielectric layer.

4. The package structure of claim 3, further comprising a second redistribution structure disposed on the first redistribution structure, wherein the second redistribution structure comprises:
a second dielectric layer disposed on the capacitor structure, wherein the compensation structures are configured to make a degree of planarization of the second dielectric layer on the compensation structures greater than about 95%;
second wiring patterns disposed on the second dielectric layer; and
a second device disposed on a portion of the second dielectric layer where the compensation structures are disposed thereunder and electrically connected to the first device.

5. The package structure of claim 4, wherein a second wiring pattern that is electrically connected to the capacitor structure among the second wiring patterns is spaced apart from the second device by at least 10 µm when viewing from top.

6. The package structure of claim 1, wherein the dummy patterns are configured to make a degree of planarization of the first dielectric layer greater than about 95%.

7. The package structure of claim 6, further comprising a second redistribution structure disposed on the first redistribution structure, wherein the second redistribution structure comprises:
a second dielectric layer disposed on the first device;
a second device disposed on the second dielectric layer and electrically connected to the first wiring pattern;
a third dielectric layer disposed on the second device; and
second wiring patterns disposed in the third dielectric layer and electrically connected to the second device.

8. The package structure of claim 7, wherein the first device comprises a wiring pattern, and the wiring pattern is configured to make a degree of planarization of the second dielectric layer ranging from about 40% to about 60%, so that the second dielectric layer comprises convex portions located on the wiring pattern and concave portions located between two neighboring portion of the wiring pattern, and the second device is disposed on the convex portions and the concave portions of the second dielectric layer.

9. The package structure of claim 7, wherein the second redistribution structure comprises a third device disposed in the third dielectric layer, and the third device is electrically connected to the second device through the second wiring patterns.

10. An antenna module, comprising:
a connection member comprising a conductive connector and an insulation layer surrounding the conductive connector;
a redistribution structure disposed on a first side of the connection member and comprising:
a first wiring pattern disposed on the connection member and electrically connected to the conductive connector;
a first dielectric layer disposed on the connection member and covering the first wiring pattern; and
an antenna device disposed above the first dielectric layer and configured to transmit and/or receive signals, wherein the antenna device is electrically connected to the first wiring pattern; and
a chip disposed below a second side of the connection member that is opposite to the first side, wherein the chip is electrically connected to the antenna device.

11. The antenna module of claim 10, wherein the redistribution structure comprises dummy patterns, and the dummy patterns are disposed in the first dielectric layer and are electrically isolated from the conductive connector.

12. The antenna module of claim 11, wherein the dummy patterns are configured to make a degree of planarization of the first dielectric layer greater than about 95%.

13. The antenna module of claim 12, wherein the redistribution structure comprises a first device disposed on the first dielectric layer and a second dielectric layer disposed on the first dielectric layer and covering the first device, and the antenna device is disposed above the second dielectric layer.

14. The antenna module of claim 13, wherein the first device comprises a wiring pattern, and the wiring pattern is configured to make a degree of planarization of the second dielectric layer ranging from about 40% to about 60%, so that the second dielectric layer comprises convex portions located on the wiring pattern and concave portions located between two neighboring portions of the wiring pattern.

15. The antenna module of claim 14, wherein the redistribution structure comprises a second device disposed on the convex portions and the concave portions of the second dielectric layer, and the second device is disposed between the antenna device and the first device and is electrically connected to the antenna device and the first device.

16. A probe card, comprising:
a connection member comprising a conductive connector and an insulation layer surrounding the conductive connector;
a first redistribution structure disposed on a first side of the connection member and comprising:
a first dielectric layer disposed on the connection member;
a first wiring pattern disposed in the first dielectric layer; and
a first device disposed above the first dielectric layer and electrically connected to the conductive connector;
a conductive probe disposed above the first redistribution structure and electrically connected to the first device; and
a substrate disposed on a second side of the connection member that is opposite to the first side, and a wiring pattern in the substrate is electrically connected to the first device of the first redistribution structure through the connection member.

17. The probe card of claim 16, wherein the first redistribution structure comprises dummy patterns, and the dummy patterns are disposed in the first dielectric layer and are electrically isolated from the conductive connector.

18. The probe card of claim 17, wherein the dummy patterns are configured to make a degree of planarization of the first dielectric layer ranging from about 40% to about 60%, so that the first dielectric layer comprises convex portions located on the dummy patterns and concave portions located between two neighboring dummy patterns, and the first device is disposed in the concave portions of the first dielectric layer.

19. The probe card of claim 16, further comprising a second redistribution structure disposed on the first redistribution structure, wherein the second redistribution structure comprises:
a second dielectric layer disposed on the first device;
second wiring patterns disposed in the second dielectric layer;
a second device disposed in the second dielectric layer and electrically connected to the first device; and
a connection pad disposed on the second dielectric layer and electrically connected to the conductive probe.

* * * * *